US006328809B1

(12) United States Patent
Elsawy et al.

(10) Patent No.: US 6,328,809 B1
(45) Date of Patent: Dec. 11, 2001

(54) VAPOR DRYING SYSTEM AND METHOD

(75) Inventors: Tamer Elsawy, Boise; R. Mark Hall, Meridian; Josh Butler, Kuna, all of ID (US)

(73) Assignee: SCP Global Technologies, Inc., Boise, ID (US)

( * ) Notice: Subject to any disclaimer, the term of this patent is extended or adjusted under 35 U.S.C. 154(b) by 0 days.

(21) Appl. No.: 09/227,637

(22) Filed: Jan. 8, 1999

Related U.S. Application Data
(60) Provisional application No. 60/103,802, filed on Oct. 9, 1998.

(51) Int. Cl.[7] .............................. B08B 3/12; C03C 23/00; C23G 1/02
(52) U.S. Cl. ...................... 134/3; 134/1; 134/2; 134/902
(58) Field of Search .............................. 134/3, 1, 2, 902; 34/78

(56) References Cited

U.S. PATENT DOCUMENTS

| | | | |
|---|---|---|---|
| 2,959,151 | 11/1960 | Ehrlich | 118/429 |
| 2,961,354 | 11/1960 | Cleveland | 134/1 |
| 2,967,120 | 1/1961 | Chaney | 124/22 |
| 3,607,549 | 9/1971 | Bieldefeld, Jr. | 156/345 |
| 3,632,462 | 1/1972 | Barrington et al. | 156/345 |
| 3,760,822 | 9/1973 | Evans | 134/99 |
| 3,813,311 | 5/1974 | Beck et al. | 156/17 |
| 3,871,914 | 3/1975 | Goffredo et al. | 134/109 |
| 3,923,072 | 12/1975 | Beaud | 134/99 |
| 3,937,531 | 2/1976 | Tipping et al. | 134/11 |
| 3,957,531 | 5/1976 | Tipping et al. | 134/11 |
| 3,964,957 | 6/1976 | Walsh | 156/345 |
| 3,977,926 | 8/1976 | Johnson, Jr. et al. | 156/17 |
| 4,017,343 | 4/1977 | Haas | 156/642 |
| 4,039,357 | 8/1977 | Bachmann et al. | 148/175 |
| 4,111,715 | 9/1978 | Sprengling et al. | 134/10 |
| 4,159,917 | 7/1979 | Gluck | 148/1.5 |
| 4,235,650 | 11/1980 | Chang et al. | 148/189 |
| 4,282,825 | 8/1981 | Nagatomo et al. | 118/58 |
| 4,318,749 | 3/1982 | Mayer | 134/25.4 |
| 4,328,081 | 5/1982 | Fazlin | 204/192 |
| 4,358,470 | 11/1982 | Rasmussen | 427/4 |
| 4,368,757 | 1/1983 | Finger | 137/565 |
| 4,383,884 | 5/1983 | Romus | 156/642 |
| 4,408,960 | 10/1983 | Allen | 417/54 |
| 4,426,246 | 1/1984 | Kravitz et al. | 156/643 |
| 4,479,849 | 10/1984 | Frantzen | 156/640 |
| 4,519,846 | 5/1985 | Aigo | 134/15 |
| 4,520,834 | 6/1985 | DiCicco | 134/63 |
| 4,577,650 | 3/1986 | McConnell | 134/59 |
| 4,589,926 | 5/1986 | Holmstrand | 134/6 |
| 4,633,893 | 1/1987 | McConnell et al. | 134/95 |
| 4,653,636 | 3/1987 | Armstrong | 206/334 |
| 4,736,758 | 4/1988 | Kusuhara | 134/66 |
| 4,778,532 | 10/1988 | McConnell et al. | 134/10 |
| 4,911,761 | 3/1990 | McConnell et al. | 134/11 |
| 4,960,141 | 10/1990 | Lenck et al. | 134/61 |
| 5,054,210 | 10/1991 | Schumacher et al. | 34/78 |
| 5,089,084 | 2/1992 | Chabra et al. | 156/646 |
| 5,092,011 | 3/1992 | Gommori et al. | 15/88.2 |
| 5,115,576 | 5/1992 | Roberson, Jr. et al. | 34/15 |
| 5,143,103 | 9/1992 | Basso et al. | 134/98.1 |
| 5,188,136 | 2/1993 | Kumagai | 134/66 |
| 5,226,242 | * 7/1993 | Schwenkler | 134/105 |
| 5,265,632 | 11/1993 | Nishi | 134/133 |
| 5,271,774 | 12/1993 | Leenaars et al. | 134/31 |
| 5,331,987 | 7/1994 | Hayashi et al. | 134/102.1 |
| 5,383,482 | 1/1995 | Yamada et al. | 134/66 |
| 5,421,905 | 6/1995 | Ueno et al. | 134/25.4 |
| 5,437,710 | 8/1995 | Grant et al. | 95/12 |
| 5,464,480 | 11/1995 | Matthews | 134/1.3 |
| 5,542,441 | 8/1996 | Mohindra et al. | 134/95.2 |

(List continued on next page.)

FOREIGN PATENT DOCUMENTS

| | | | |
|---|---|---|---|
| 0 782 889 A2 | 7/1997 | (EP) | B08B/3/04 |
| 0784336A2 | 7/1997 | (EP) . | |
| 0907200A2 | 7/1999 | (EP) . | |
| 46-25833 | 12/1972 | (JP) . | |
| 57-210633 | 12/1982 | (JP) | 21/306 |
| 245639 | of 1987 | (JP) . | |
| 62-198126 | 9/1987 | (JP) . | |
| 111987 | of 1988 | (JP) . | |
| 4-83340 | 3/1992 | (JP) | 21/304 |
| 4-151835 | 5/1992 | (JP) | 21/304 |
| 4-251930 | 9/1992 | (JP) | 21/304 |
| 4-323824 | 11/1992 | (JP) | 21/304 |
| 5-13397 | 1/1993 | (JP) . | |
| 5-136116 | 6/1993 | (JP) . | |
| 5-283386 | 10/1993 | (JP) | 21/304 |
| 5-283391 | 10/1993 | (JP) | 21/304 |
| 5-326464 | 12/1993 | (JP) | 21/302 |
| 06-163501 | 6/1994 | (JP) | 21/304 |
| 08061846 | 8/1996 | (JP) . | |
| 9162154 | 6/1997 | (JP) | 21/304 |

OTHER PUBLICATIONS

Klaus Wolke. "Marangoni Wafer Drying Avoids Disadvantages" Solid State Technology. Aug. 1996.

G. Zou et al. "Elimination of HF–last Cleaning Related CoSi2 Defects Formation" Proceedings of the Second International Symposium on Ultra–Clean Processing of Silicon Surfaces. (UCPSS '94) 1994.

(List continued on next page.)

*Primary Examiner*—Randy Gulakowski
*Assistant Examiner*—Yolanda E. Wilkins
(74) *Attorney, Agent, or Firm*—Stallman & Pollock LLP

(57) ABSTRACT

The present apparatus is a method and system for treating and drying the surface of an object. According to the described method, with a wet object positioned in a vessel, a drying vapor is introduced into the vessel. The drying vapor condenses on the surface of the object and reduces the surface tension of the residual process fluid, causing the residual process fluid to flow off of the surface. In one embodiment, wet processing of the object and a subsequent evacuation of process fluid is carried out in the vessel prior to introduction of the drying vapor.

74 Claims, 12 Drawing Sheets

U.S. PATENT DOCUMENTS

| | | | |
|---|---|---|---|
| 5,551,459 | 9/1996 | Ohmori et al. | 134/61 |
| 5,569,330 * | 10/1996 | Schild et al. | 134/1 |
| 5,571,337 * | 11/1996 | Mohindra et al. | 134/25.4 |
| 5,634,978 * | 6/1997 | Mohindra et al. | 134/2 |
| 5,660,642 | 8/1997 | Britten | 134/30 |
| 5,685,327 * | 11/1997 | Mohindra et al. | 134/95.2 |
| 5,715,612 | 2/1998 | Schwenkler | 34/470 |
| 5,725,753 | 3/1998 | Harada et al. | 205/746 |
| 5,752,532 * | 5/1998 | Schwenkler | 134/102.3 |
| 5,772,784 * | 6/1998 | Mohindra et al. | 134/21 |
| 5,782,990 | 7/1998 | Murakami et al. | 134/26 |
| 5,788,448 | 8/1998 | Wakamori et al. | 414/222 |
| 5,803,980 | 9/1998 | Pas et al. | 134/2 |
| 5,807,439 | 9/1998 | Akatsu et al. | 134/32 |
| 5,813,819 | 9/1998 | Ohsawa et al. | 414/416 |
| 5,817,185 | 10/1998 | Shindo et al. | 134/25.4 |
| 5,826,129 | 10/1998 | Hasebe et al. | 396/611 |
| 5,849,104 * | 12/1998 | Mohindra et al. | 134/25.4 |
| 5,868,150 * | 2/1999 | Mohindra et al. | 134/135 |
| 5,873,947 * | 2/1999 | Mohindra et al. | 134/21 |
| 5,878,760 * | 3/1999 | Mohindra et al. | 134/95.2 |
| 5,891,256 * | 4/1999 | Mohindra et al. | 134/2 |
| 5,932,027 * | 8/1999 | Mohindra et al. | 134/21 |
| 5,958,146 * | 9/1999 | Mohindra et al. | 134/2 |
| 5,988,189 * | 11/1999 | Mohindra et al. | 134/95.2 |
| 6,004,399 | 12/1999 | Wong et al. | 134/2 |
| 6,029,371 | 2/2000 | Kamikawa et al. | 34/516 |
| 6,045,621 | 4/2000 | Puri et al. | 134/2 |

OTHER PUBLICATIONS

Sean O'Brien et al. "The Impact of Integrated Pre–Cleans on Gate Oxide Integrity" Proceedings of the Second International Symposium on Ultra–Clean Processing of Silicon Surfaces. (UPCSS '94) 1994.

R. Schild et al. "Marangoni Drying: A New Concept for Drying Silicon Wafers" Proceedings of the Second International Symposium on Ultra–Clean Processing of Silicon Surfaces. (UPCSS '94) 1994.

A. F. M. Leenaars et al. "Marangoni Drying: A New Extremely Clean Drying Process" Langmuir. The ACS Journal of Surfaces and Colloids. Nov. vol. 6, No. 11 1990.

L. Li et al. "Improvement and Evaluation of Drying Techniques for HF–last Wafer Cleaning" Proceedings of the Second International Symposium on Ultra–Clean Processing of Silicon Surfaces. (UCPSS '94) 1994.

D. Fullarton et al. "Condensation of Isopropanol–Stream Mixtures" International Chemical Engineering vol. 27, No. 4, Oct. 1987.

D. Fullarton et al. "Condensation of Isopropanol–Steam Mixtures" International Chemical Engineering vol. 27, No. 4, Oct. 1987.

Anonymous, "Drying of Substrates after Treatment in a Liquid" Research Disclosure 32778 Jul. 1991.

Wolke et al. "Marangoni wafer drying avoids disadvantages" Solid State Tech. pp. 87–90 Aug. 1996.

Marra J., "Ultraclean Marangoni Drying " Particles in Gases and Liquids 3: Detection, Characterization, and Control, Plenum Press, NY 1993.

O'Brien, S.B.G.M. "On Marangoni Drying" J. Fluid Mech. vol. 254, pp. 649–670 1993.

Marra, J. et al. "Physical Principles of Marangoni Drying" Langmuir (7), pp. 2748–2755 1991.

Huethorst, J.A.M. et al. "Motion of Marangoni–Contracted Water Drops Across Inclined Hydrophilic Surfaces" Langmuir (7) pp. 2756–2763 1991.

Koppenbrink et al. Particle reduction on silicon wafers as a result of isopropil alcohol vapor displacement drying after wet processing, in Particles on Surfaces 2. editor K.L. Mittal, Plenum Press, 1989.

"Effects of Drying Methods and Wettability of Silicon on the Formation of Water Marks in Semiconductor Processing-"Park et al., pp. 2028–2031., Journal Electrochemical Society, vol. 142, No. 6, Jun. 1995.

D. J. Riley and R. G Carbonell. "The Deposition of Contamminants from Deionized Water onto Hydryphobic Silicon Wafers", Journas of the EIS. pp. 28–34, Nov./Dec. 1991.

N. D. Casper and B. W. Soren, "Semiconductor Yield Enhancement through Particle Control", Emerging Semiconductor Technology, pp. 423–435.

M. Itano, F. W. Kern, Jr., R. W. Rosenberg, M. Miyashita, I. Kawanabe and T. Ohmi, "Particle Deposition and Removal in Wet Cleaning Processes for ULSI Manufacturing,", IEEE Trans. on Semiconductor Manufacturing vol. 5, No. 2, pp. 114–120, May 1992.

Y. Yagi, T. Imoaka, Y. Kasama, and T. Ohmi, "Advanced Ultrapure Water Systems with Low Dissolved Oxygen for Native Oxide Free Water Processing", IEEE Trans. On Semiconductor Manufacturing, vol. 5, No. 2, pp. 121–127. May 1992.

H. G. Parks J. F. O'Hanlon, and F. Shadman, "Research Accomplishments at the University of Arizona Sematech Center of Excellence of Contamination/Defect Assessment and Contol", IEEE Trans. on Semiconductor Manufacturing, vol. 6, No. 2 pp. 134–142, May 1993..

C. McConnell, "Examining the Effects of Water Surface Chemistry on Particle Removal Using Direct –Displacement Isopropy Alcohol Drying", Micro–Contamination, Feb. 1991.

C. McConnell, "Examining the Effects of Wafer Surface Chemistry on Particle Removal Using Direct–Displacement Isopropyl Alcohol Drying", MicroContamination, Feb. 1991.

M. B. Olesen, "A Comparative Evaluation of the Spin Rinser/Dryer with the IPA Vapor Isodry Technique", Proceedings—Institute of Environmental Sciences. pp. 229–241, 1990.

G. D. Moss et al. "Capillary Drying: Particle–Free Wet Process Drying?" Date Unknown.

Klaus Wolke. "Marangoni Wafer Drying Avoids Disadvantages" Solid State Technology. Aug. 1996.

G. Zou et al. "Elimination of HF–last Cleaning Related CoSi2 Defects Formation " Proceedings of the Second International Symposium on Ultra–Clean Processing of Silicon Surfaces. (UCPSS '94) 1994.

Sean O'Brien et al. "The Impact of Integrated Pre–Cleans on Gate Oxide Integrity" Proceedings of the Second International Symposium on Ultra–Clean Processing of Silicon Surfaces. (UCPSS '94) 1994.

R. Schild et al. "Marangoni Drying: A New Concept for Drying Silicon Wafers" Proceedings of the Second International Symposium on Ultra–Clean Processing of Silicon Surfaces. (UPCSS '94) 1994.

A. F. M. Leenaars et al. "Marangoni Drying: A New Extremely Clean Drying Process" Langmuir. The ACS Journal of Surfaces and Colloids. Nov. Vol. 6, No. 11 1990.

L. Li et al., "Improvement and Evaluation of Drying Techniques for HF–last Wafer Cleaning" Proceedings of the Second International Symposium on Ultra–Clean Processing of Silicon Surfaces. (UCPSS '94) 1994.

* cited by examiner

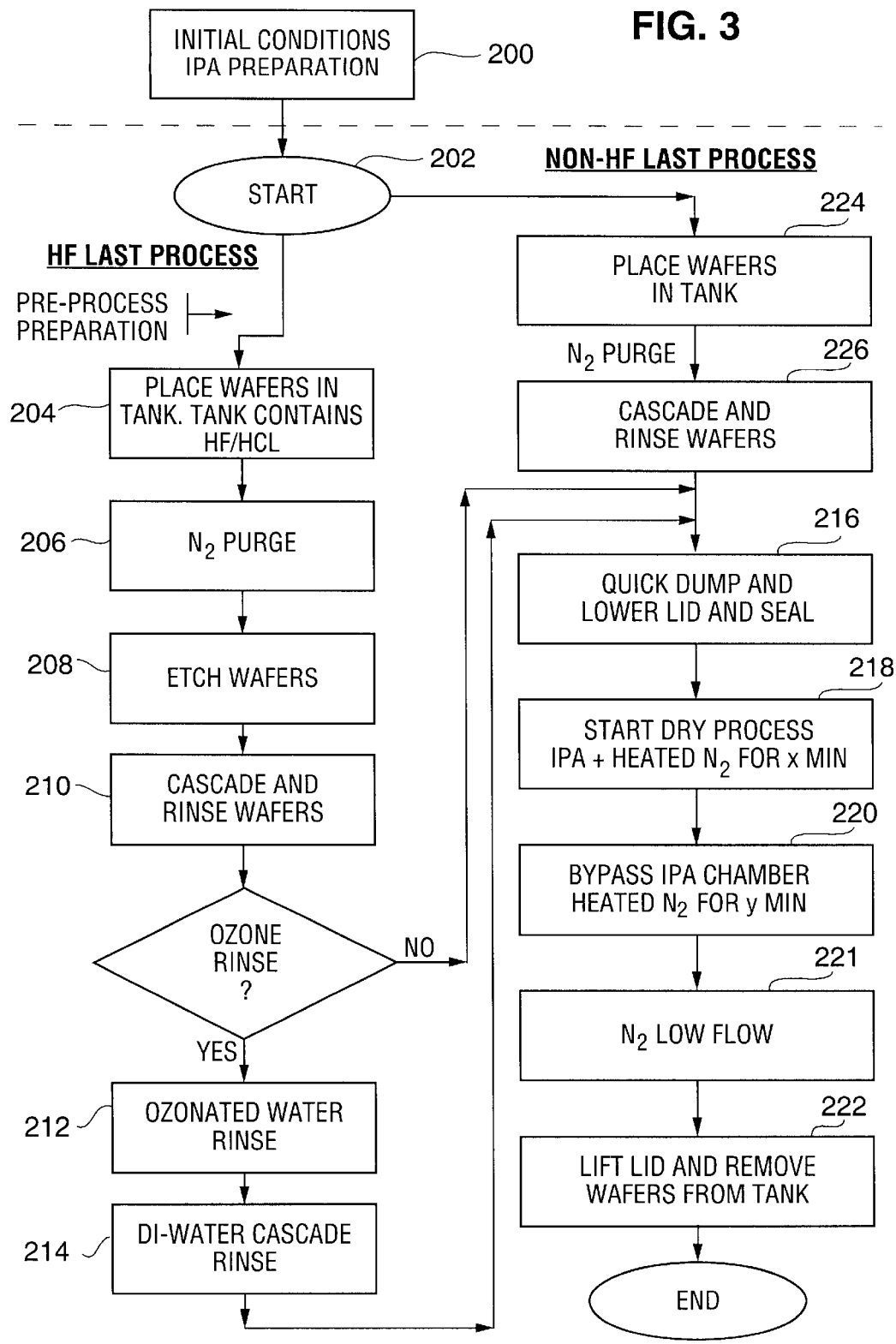

VAPOR DRYING SYSTEM AND METHOD

This application claims the benefit of U.S. Provisional Application No. 60/103,802, filed Oct. 9, 1998.

FIELD OF THE INVENTION

The present invention relates generally the field of systems for processing and cleaning objects requiring a high level of cleanliness, and more particularly to a dryer system and drying process for drying such objects using a drying vapor.

BACKGROUND OF THE INVENTION

In certain industries there are processes that must be used to bring objects to an extraordinarily high level of cleanliness. For example, in the fabrication of semiconductor wafers, multiple cleaning steps are typically required to remove impurities from the surfaces of the wafers before subsequent processing. The cleaning of a wafer, known as surface preparation, has for years been performed by collecting multiple wafers into a batch and subjecting the batch to a sequence of chemical and rinse steps and eventually to a final drying step. A typical surface preparation procedure involves bathing the wafers in an etch solution of HF and HCl to remove surface oxidation and metallic impurities. Afterwards, the wafers are thoroughly rinsed in high purity deionized water (DI) to remove etch chemicals from the wafers. The rinsed wafers are then dried using one of several known drying processes.

Currently, there are several types of tools and methods used in industry to carry out the surface preparation process. The tool most prevalent in conventional cleaning applications is the immersion wet cleaning platform, or "wet bench." In wet bench processing, a batch of wafers is dipped into a series of process vessels, where certain vessels contain chemicals needed for clean or etch functions, while others contain deionized water ("DI") for the rinsing of these chemicals from the wafer surface. Megasonic energy may be imparted to the wafers using piezoelectric transducers coupled to one or more of the vessels in order to more thoroughly clean the wafer surfaces. In the final process vessel, the rinse fluid is removed from the wafer surface using a solvent such as isopropyl alcohol (IPA). IPA is an organic solvent known to reduce the surface tension of water.

In one IPA drying method, described in U.S. Pat. No. 5,226,242 (Schwenkler), wet substrates are moved into a sealed vessel and placed in the processing region of the vessel. An IPA vapor cloud is generated in a vapor-generating region of the vessel and is directed into the processing region, where it removes water from the wafers. This drying technology is highly effective in removing liquid from the wafers, but is not easily adaptable to single vessel systems in which chemical processing, rinsing, and drying can be carried out in a single vessel.

Environmental concerns have given rise to efforts to improve drying technology in a manner that minimizes IPA usage. One such improved drying technology is the Marongoni technique, which is illustrated schematically in FIG. 1. In one application of the Marongoni technique, an IPA vapor is condensed on top of the rinse water containing the wafers while the wafers are slowly lifted from the processing vessel. The concentration of the dissolved vapor is highest at the wafer surfaces S and lower at regions of the rinse fluid that are spaced from the wafer surfaces. Because surface tension decreases as IPA concentration increases, the surface tension of the water is lowest at the wafer surface where the IPA concentration is highest. The concentration gradient thus results in "Marongoni flow" of the rinse water away from the surfaces of the wafers as indicated by arrow A. Rinse water is thereby stripped from the wafer surfaces, leaving the wafer surfaces dry.

Another application of the Marongoni technique is described in U.S. Pat. No. 4,911,761 (McConnell), which describes a single chamber system for cleaning, rinsing and drying wafers. As described in the patent, a batch of wafers is placed into a single closed vessel, and process fluids are passed from top to bottom sequentially through the vessel. The method further employs a process called "direct displacement drying" to dry the wafers after the final rinse. The drying step is accomplished using an IPA drying vapor introduced into the vessel as the rinse fluid is slowly drained. The IPA vapor displaces the receding rinse water and condenses on the surface of the rinse water in the vessel, creating Marongoni flow from the wafer surfaces into the receding rinse water and resulting in dry wafers.

While providing satisfactory drying results and reducing IPA usage, the direct displacement drying method leaves further room for improvement. For example, because this process relies in part on the pulling (or surface tension) by the descending rinse fluid in the process vessel, it is not adaptable to systems in which rinsing is carried out in a separate vessel and then transferred into a drying vessel. Moreover, the rate at which the deionized water is drained from the vessel must be closely controlled to achieve full benefit of the Marongoni effect.

In a cleaning and drying process described in U.S. Pat. No. 5,571,337 (Mohindra), wafers within a vessel are exposed to process chemicals and subsequently rinsed in DI water to remove residual chemicals. After rinsing, an IPA cleaning step is carried out which utilizes Marongoni flow to remove remaining particles from the wafer surface. This cleaning step involves directing an IPA vapor into the vessel while the DI rinse water is slowly drained, creating Marongoni flow from the wafer surfaces into the receding rinse water. According to the patent, if the rate at which the rinse water recedes is carefully controlled, this flow can be made to carry residual particles away from the wafer surfaces and results in cleaner wafers. In addition to cleaning particles from the wafers, the Marongoni flow during the IPA step removes a substantial amount of rinse water from the wafers. However, water droplets remain on the wafer surfaces at the end of the IPA step, and so hot nitrogen gas is directed onto the wafers to evaporate the residual water droplets. While this process is desirable in that it reduces IPA usage over conventional drying processes, the residual water droplets are problematic in that they may leave impurities on the wafer surfaces.

An object of the present invention is thus to provide an improved drying method and apparatus which is thorough, which minimizes solvent usage, and which is highly adaptable for use in a variety of surface preparation systems and processes.

SUMMARY OF THE INVENTION

The present apparatus is a method and system for treating and drying the surface of an object. According to the described method, with a wet object positioned in a vessel, a drying vapor is introduced into the vessel. The drying vapor condenses on the surface of the object and reduces the surface tension of the residual process fluid, causing the residual process fluid to flow off of the surface. In one

BRIEF DESCRIPTION OF THE DRAWINGS

FIG. 3 is a flow diagram illustrating examples of process steps which may be carried out using the drying systems of FIGS. 2 and 8 during an HF last (etch), rinse, and dry process.

DETAILED DESCRIPTION OF THE DRAWINGS

The present invention is a vapor drying system and method that is highly adaptable to use with various processing methods. For example, the system and method may be used for drying alone, in which case wet objects may be transferred from a separate wet treatment vessel into the vessel of the drying system. As another example, the vessel of the drying system may be used for surface passivation processes that precede drying, such as etch, ozone rinse, and DI rinse processes use in wafer processing, as well as for the subsequent drying process.

The system and method according to the present invention will be described in the context of surface preparation for semiconductor substrates. This is done for purposes of illustration only and is not intended in a limiting sense. The system and method of the present invention are equally suitable for use on other objects for which a high level of cleanliness is needed. Examples of such other objects include, but are not limited to flat panel displays, optical and magnetic recording disks, and photomasks. It should also be noted that, although referred to as a "drying system and method" the system and method of the present invention are adaptable for use in a variety of applications, which may or may not include chemical processing and rinse steps.

It is also noteworthy that, while isopropyl alcohol ("IPA") is identified herein as the preferred drying compound/vapor utilized in the system, the present invention is equally suitable for use with other drying compounds/vapors now known or developed in the future. Such alternatives are considered to lie within the scope of the present invention. Examples include other polar organic compounds like IPA, as well as methane, HFE, other alcohols and other substances that are substantially free of polar organic compounds, including argon and nitrogen.

STRUCTURE

First Embodiment

Figure 1:
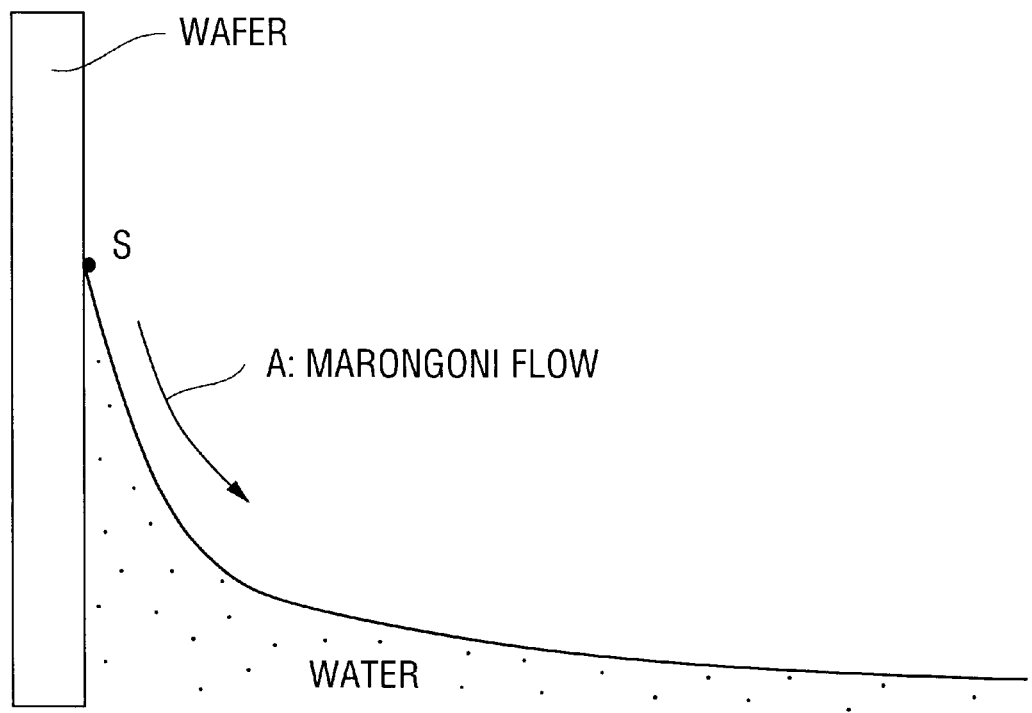
FIG. 1 is a side elevation view of a wafer schematically illustrating Marongoni flow from a wafer surface during Marongoni drying processes.
Figure 2:
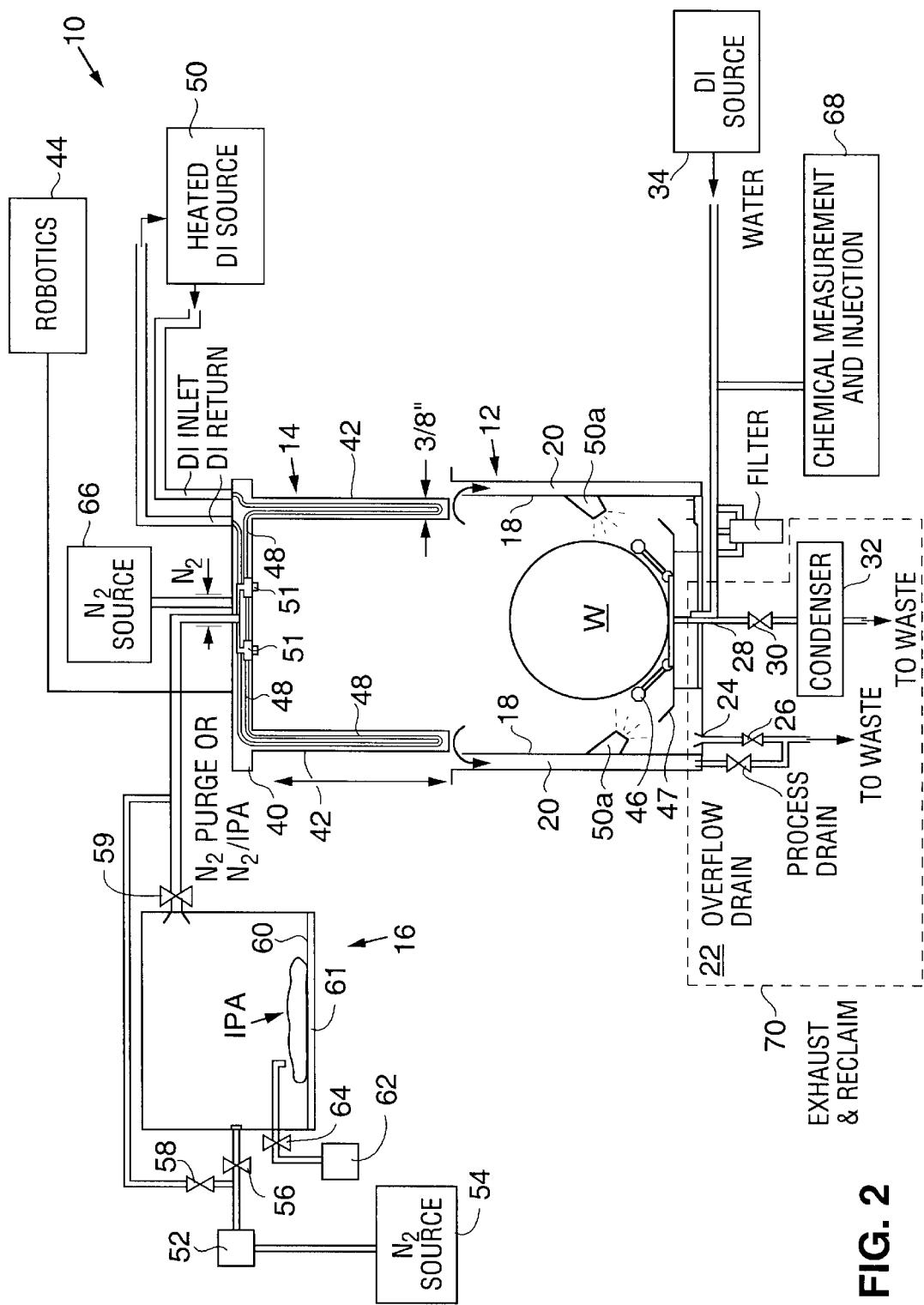
FIG. 2 is a schematic representation of a first embodiment of a drying system in accordance with the present invention.

One embodiment of a system according to the present invention is illustrated schematically in FIG. 2. Generally speaking, system 10 includes a rinse/dry vessel 12, a moveable lid 14, a drying vapor generation chamber 16 remote from the vessel, a chemical injection component 68, an exhaust and reclamation component 70, and various drains and inlets described in greater detail below.

The rinse/dry vessel 12 is a process vessel of any size and shape suitable for receiving and processing a batch of semiconductor wafers. Vessel 12 preferably has an inner tank section 18 surrounded at its side, front and rear walls by an overflow weir 20. The weir 20, which is of a type found on many conventional rinse tanks, allows processing fluids to cascade over the vessel walls during certain applications. An overflow drain 22 is formed in the weir 20, and a process drain 24 is formed in the base of the inner tank section 16. Valve 26 controls the opening and closing of the drain 24. A separate drain 28 and valve 30 are used for IPA drainage. A condenser 32 is provided for condensing exhausted IPA into a disposable form.

A source of rinse fluid 34 is fluidly coupled to a rinse fluid inlet 36 in the base of the vessel 12. The system may be provided with a filter for filtering the rinse fluid as it flows towards the vessel, although many fabrication facilities come equipped with separate filtering systems that yield rinse fluid of the appropriate level of purity. During use, rinse water flows into the vessel, passes through the vessel and cascades over the interior vessel walls to the overflow weir 20. The rinse fluid exits the weir via drain 22 for disposal.

Lid 14 is formed of a top wall 40 and four side walls 42 descending from the top wall 40 to form a bottomless enclosure. The lid 14 is moveable by a robotic system 44 between a lowered position and an elevated position. In the lowered position, side walls 42 extend into the interior tank section 18 and make sealing contact with the tank bottom, while the top wall 40 extends across the opening at the top of the vessel. When fully lowered the top wall 40 preferably makes sealing contact with the sidewalls forming the vessel interior and overflow weir sections. This arrangement prevents vapors from escaping from the vessel during processing, and it also prevents any gases or particulate matter that may be in the surrounding environment from passing into the vessel.

In the elevated position, the lid 14 is spaced from the vessel 12 by a sufficient distance to allow wafers W on a wafer cassette 46 to be lowered into and removed from the vessel 12. Robotics system 44 may be configured to move the lid 14 along a vertical axis between the lowered and raised positions. It may alternatively be configured for multi-axis movement, so as to position the lid above and to one side of the vessel opening for movement of wafers into and out of the vessel.

As with the vessel 12, the lid 14 is formed of a material that is inert to the process chemicals that will be used in the system. The lid is further equipped with a heating system that maintains the lid walls 40, 42 at an elevated temperature. As will be discussed in greater detail with respect to FIG. 2, heating the lid is beneficial in that it minimizes drying vapor condensation on the lid, and thus leaves more of the drying vapor available for condensing on the cool wafer surfaces.

This allows drying to be carried out using a minimum of IPA or other drying solvent.

Naturally, many systems may be conceived of for heating the lid. One system found useful for this purpose relies upon a system of heating elements embedded in the walls 40, 42. In a preferred system, these heating elements are fluid conduits 48 coupled to a source 50 of hot fluid, such as heated deionized water. The heated fluid is circulated through the conduits in the walls 40, 42, heating the walls and keeping them at an elevated temperature (which is preferably selected to be above the temperature of the rinse fluid used to rinse the wafers). Naturally, the specific arrangement of the conduits 48 within the walls 40, 42 is not critical, so long as the arrangement is adequate to circulate the heated liquid through the walls in a manner which maintains the walls at or above the desired elevated temperature. As another alternative, the lid may be heated by heated nitrogen directed onto the surfaces of the lid.

Top wall 40 of the lid is equipped with one or more inlets 51 that are used to introduce vapors into the vessel. These inlets provide the $N_2$ gas used to purge the vessel of air so as to prevent oxidation of wafers inside the vessel, as well as the drying vapors used to effect drying.

In one embodiment of the present invention, drying is carried out using an initial IPA step in which IPA vapor is carried into the vessel by heated $N_2$ gas. The IPA step is followed by the step of introducing heated $N_2$ into the vessel to volatilize condensed IPA remaining on the wafers and cassette. The $N_2$ used for both purposes is heated by an $N_2$ heater 52, which receives the nitrogen from an $N_2$ source 54. Plumbing is provided for flowing the heated $N_2$ into the IPA chamber 16 when needed for the $N_2$/IPA drying step, and for flowing the heated $N_2$ directly into the vessel when needed for the second, heated $N_2$, drying step. Valve 56 allows $N_2$ flow into the IPA chamber to be stopped and started, and valve 58 similarly controls $N_2$ flow directly into the vessel via the bypass plumbing. When opened, an $N_2$/IPA outlet valve 59 allows $N_2$/IPA to flow from the chamber 16 into the vessel 12.

IPA chamber 16 is preferably an electropolished high purity stainless steel chamber having a bottom wall 60 and a heating element 61 adjacent to the bottom wall 61 for heating the bottom wall. During use, a pre-measured quantity of liquid IPA is fed from IPA reservoir 62 onto the bottom wall of chamber 16.

A source of room temperature $N_2$ 66 is connected to lid 14 and is configured to allow gas from source 66 to flow into the vessel via inlets 51.

If the system is to be utilized for chemical processes such as cleaning and/or etching, it may further be provided with a chemical dispensing component 68 which measures process chemicals and injects them into the DI water stream, which carries them into vessel 12.

OPERATION

First Embodiment

The system of FIG. 2 is adaptable for use in a variety of applications, including those which involve chemical processing and rinse steps carried out within or external to the vessel 12. FIG. 3 is a simplified flow diagram illustrating one use of the drying system of FIG. 2, in which surface oxidation is removed using an HF/HCl etch, and in which the wafers are subsequently rinsed, and dried.

IPA vapor generation is preferably carried out in the early stages of the process, but in any event prior to the moment at which the wafers are ready for drying. Step 200. IPA vapor is created within the IPA chamber 16 by injecting a pre-measured quantity of IPA liquid onto surface 60 of chamber, which is heated by heating element 61. The IPA is heated on surface 60 to a temperature preferably less than the boiling point of IPA (which is 82.4° C. at 1 atmosphere). Heating the IPA increases the rate at which IPA vapor is generated and thus expedites the process, creating a dense IPA vapor cloud.

The process preferably begins with lid 14 positioned away from the opening in the vessel, and with heated DI circulating within fluid conduits 48 to heat the walls 40, 42 of the lid to a temperature that will promote IPA vapor condensation on the wafer surfaces rather than on the lid. DI flow into the vessel is initiated, while etch chemicals (for example, HF and HCl) are simultaneously injected into the DI stream as it flows into the vessel, to fill the vessel with an etch solution having the desired concentration. Step 204.

A wafer cassette 46 (FIG. 2) carrying wafers W is lowered into the vessel and positioned on the wafer support 47. Step 204. Lid 14 is next moved into a position suspended above the vessel (such as the position shown in FIG. 2). $N_2$ gas from a source 66 (which may, but need not be, the same as source 54) is introduced into the vessel via inlets 50 to purge the system of air.

The wafers remain immersed in the process chemicals for a pre-determined period of time as needed to complete etching. Step 208. At the end of the etch period, rinse fluid is pumped into the vessel 12 via inlet 36, and cascades into the overflow weir 20 and out the overflow drain 22. Step 210. If an ozone rinse is desired, the wafers are next rinsed using ozonated DI water. Step 212. This may be carried out by injecting ozone into the rinse water via a separate inlet in the vessel 12, or into the DI stream using chemical dispensing component 68. After the ozone rinse, pure DI rinsing continues for a sufficient period of time to thoroughly rinse the wafers and cassette, Step 214, after which time the process drain 24 is opened to quickly drain the rinse fluid from the vessel ("quick dump"). Step 216. While the rinse water is being discharged, lid 114 is moved by robotics system 44 into its lowered position within the vessel. Preferably, $N_2$ gas from ambient temperature source 66 flows out of inlet(s) 51 as the lid is lowered in order to maintain the purged environment within the vessel.

As discussed, generation of IPA vapor is initiated within the IPA chamber 16 early in the process. Shortly before the drying step, valve 56 is briefly opened, permitting heated $N_2$ gas to fill the chamber 16. Once the vessel has been drained and the lid fully lowered, valve 59 is opened, causing the heated $N_2$ to carry the IPA vapor into the vessel. Step 218.

As is typical of hot vapors, the IPA vapor condenses on the cool surfaces with which it comes into contact. Because the lid's walls are heated, the hot IPA vapor condenses on the relatively cool wafer surfaces rather than on the lid walls. It should be appreciated that this use of heated walls to promote condensation on the wafers allows IPA usage to be minimized, since there is little IPA "wasted" due to condensation on vessel surfaces.

The vapor condenses on the wafers, breaking the surface tension of water on the wafers and thus shearing the rinse water from the wafer surfaces.

At the end of the IPA drying step, valve 59 is closed, and bypass valve 58 is opened, causing heated $N_2$ to flow directly into the vessel. Step 220. It should be noted that additional gas inlets 51a (FIG. 2) may be positioned within the vessel 12 and oriented to direct the gas onto the cassette to facilitate drying during this step. The heated gas completes the drying process by volatilizing condensed IPA that remains on the wafer and cassette surfaces.

The heated $N_2$ gas removes the condensed IPA by evaporation and exhausts the IPA through IPA drain 28 into condenser 32. Condenser 32 condenses the IPA to a liquid form suitable for disposal.

Afterwards, lid 14 is withdrawn by robotics system 44, and the fully dried wafers and cassette are removed from the vessel. Step 222.

As discussed, the system 10 is useful for other processes, as well. For example, the system 10 may be utilized as a component of a larger system in which wafers are processed and rinsed in a separate vessel. For an operation of that type, use of the system 10 might begin just after the rinse steps, with wet wafers being lowered into the vessel 12 for drying. Steps 224, 226, 216, 218, 220, 222. As another example, for certain surfaces it may be desirable to skip the HF last step and to use the system to carry out an ozone rinse/rinse/dry process. Steps 212, 214, 216, 218, 220, 222. An ozone rinse produces a hydrophilic surface on the wafer, whereas the HF last process described above produces a hydrophobic surface. The drying process described herein is beneficial in that it works well regardless of whether the wafer surface is a hydrophilic or hydrophobic.

STRUCTURE

Second Embodiment

FIGS. 4A through 7 illustrate a second embodiment of a drying system utilizing concepts in accordance with the present invention. The second embodiment is similar to the first embodiment, and differs from the first embodiment primarily in the structure and use of the lid.

Figure 4A:
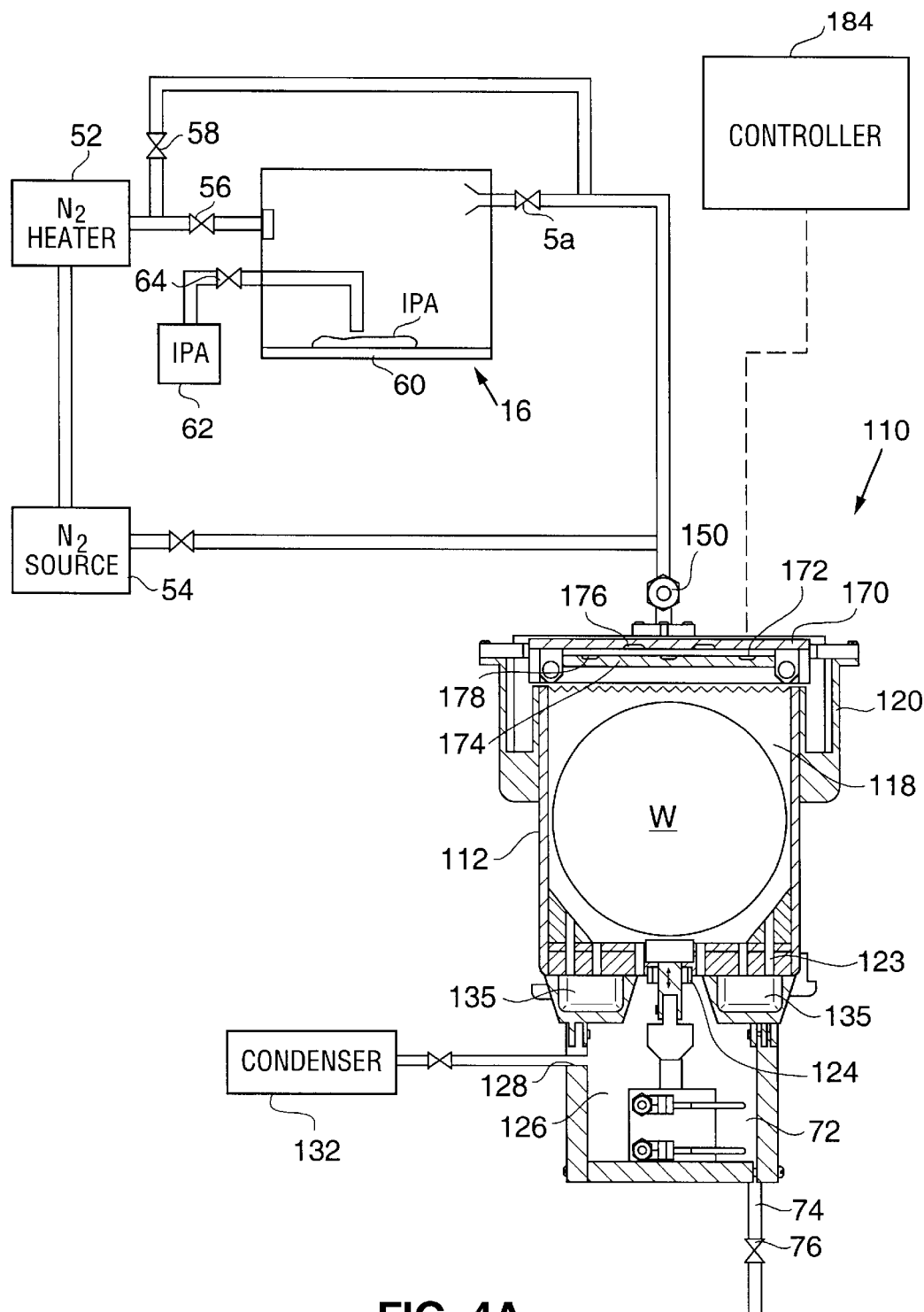
FIG. 4A is a cross-sectional front view of a drying vessel in accordance with the present invention, together with a schematic illustration of drying system components.
Figure 4B:
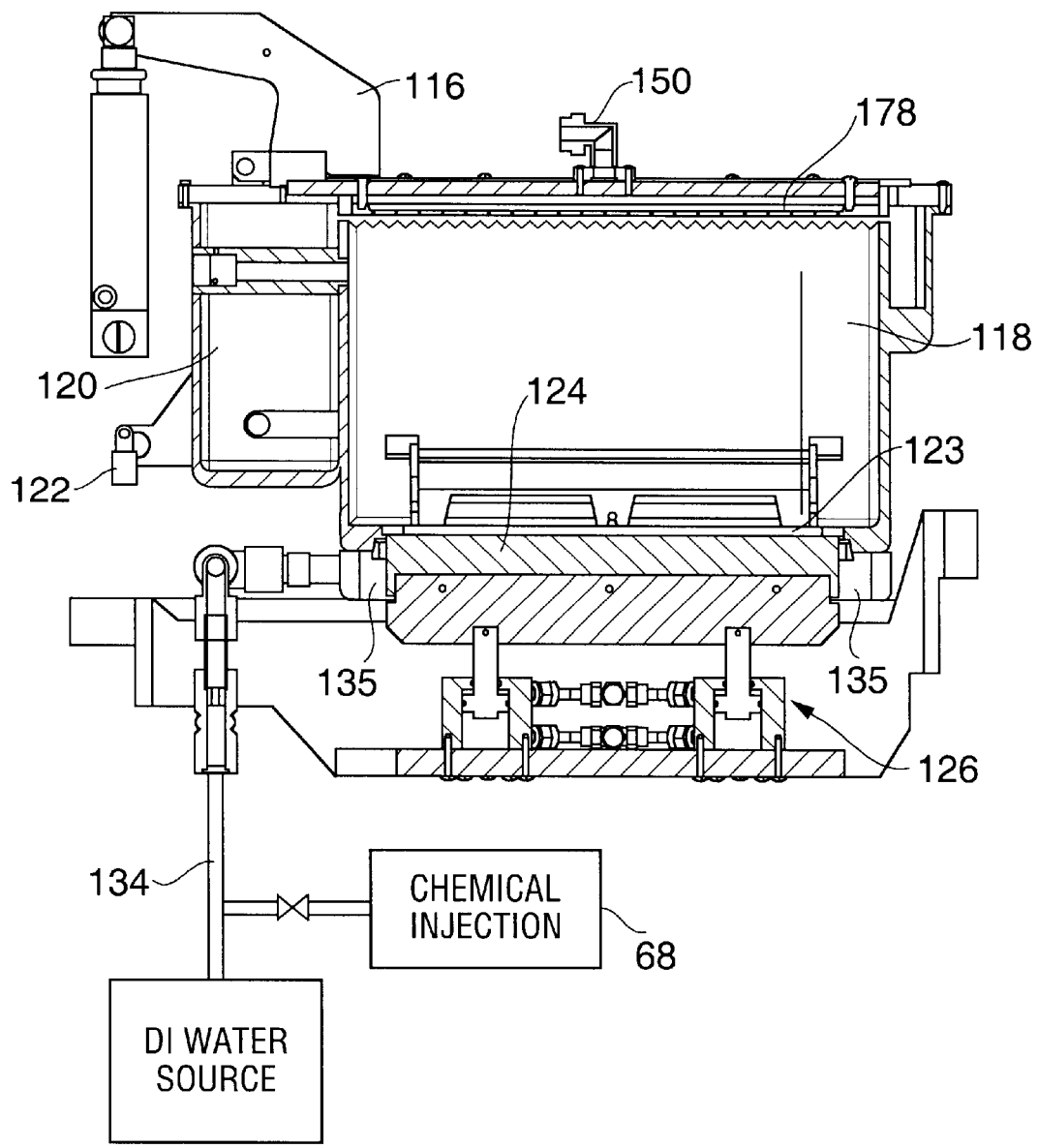
FIG. 4B is a cross-sectional end view of the drying vessel of FIG. 4A.
Figure 4C:
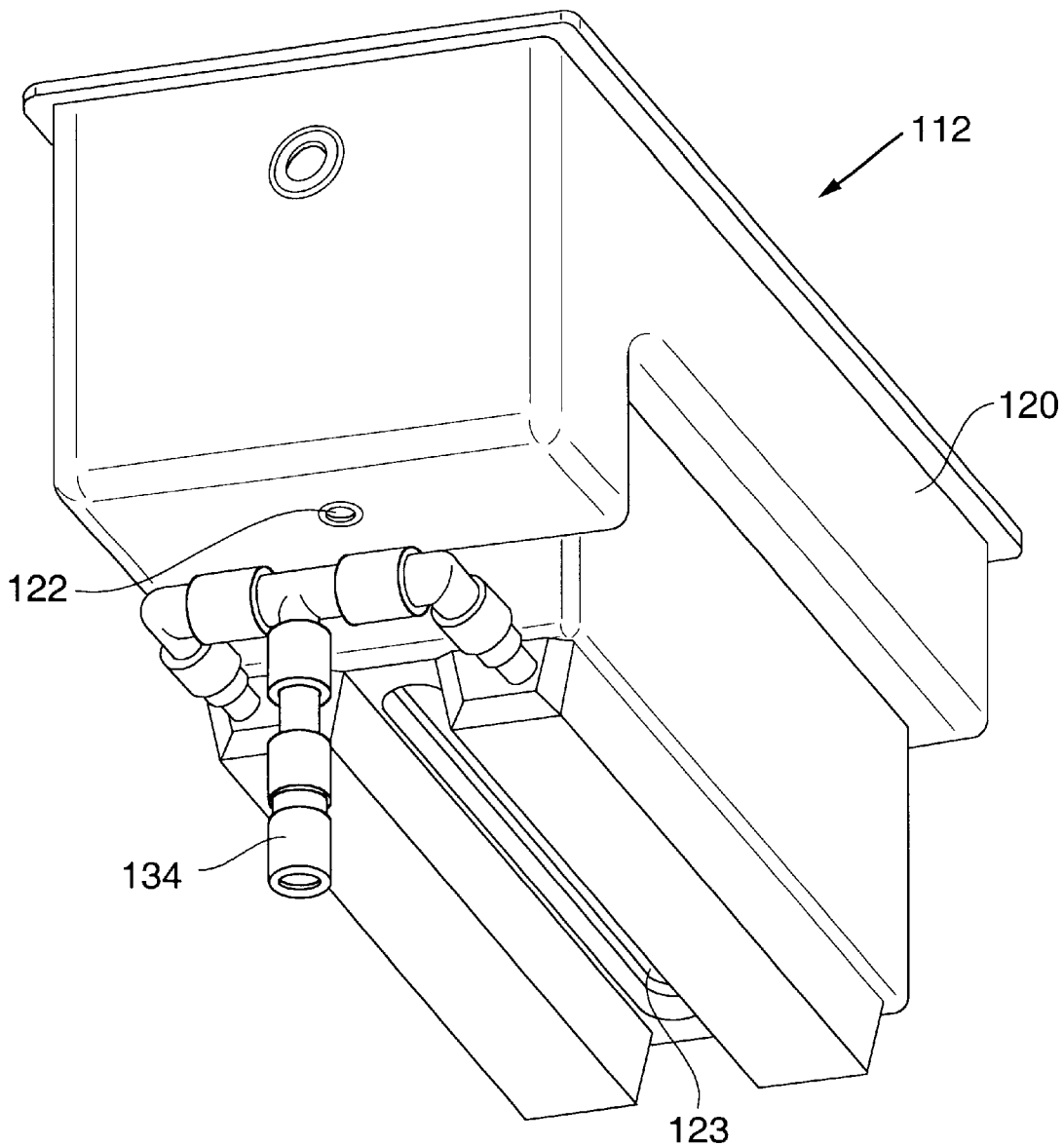
FIG. 4C is a bottom perspective view of the vessel, in which the lid and dump door components are not shown.
Figure 5:
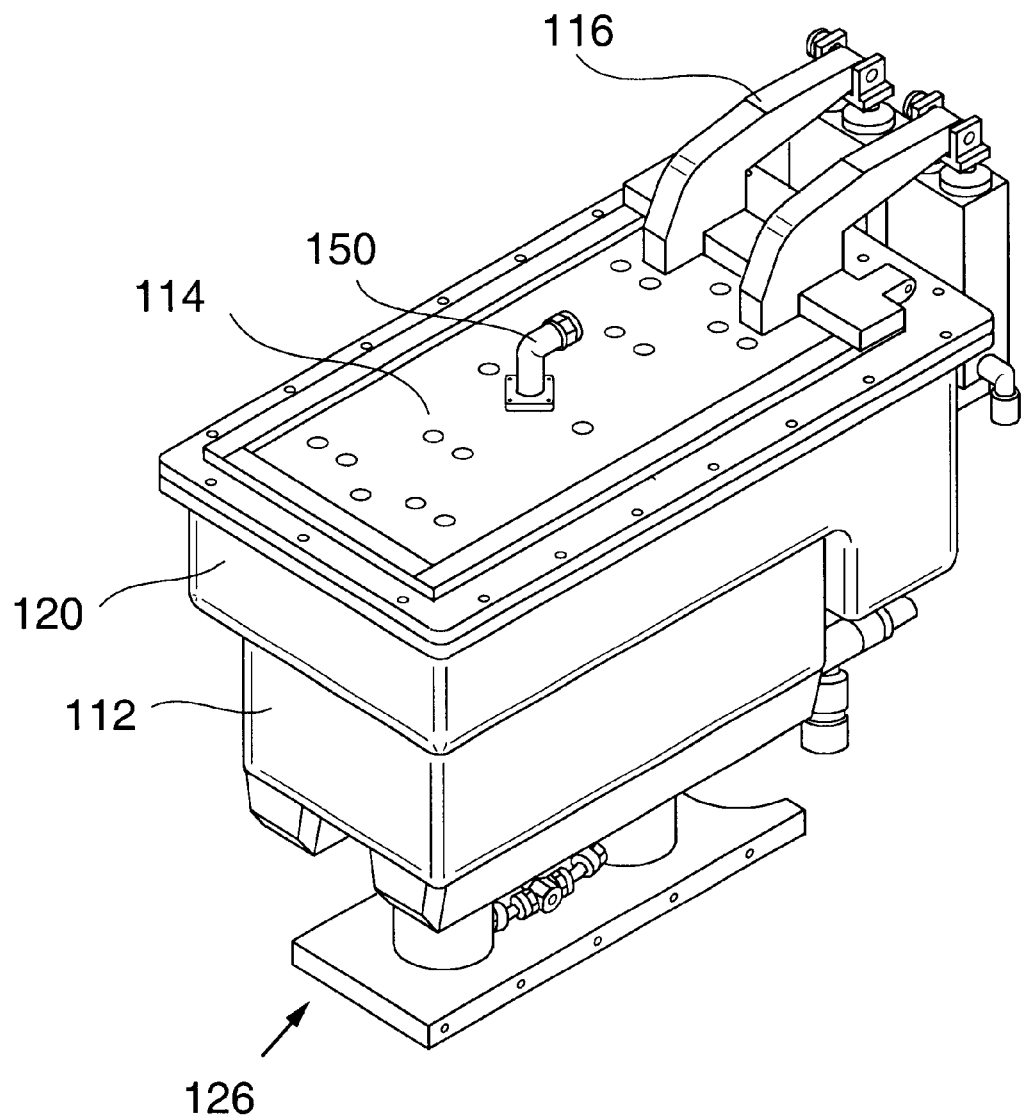
FIG. 5 is an exploded view of the drying vessel of FIG. 4A, showing the lid in the closed position.
Figure 6:
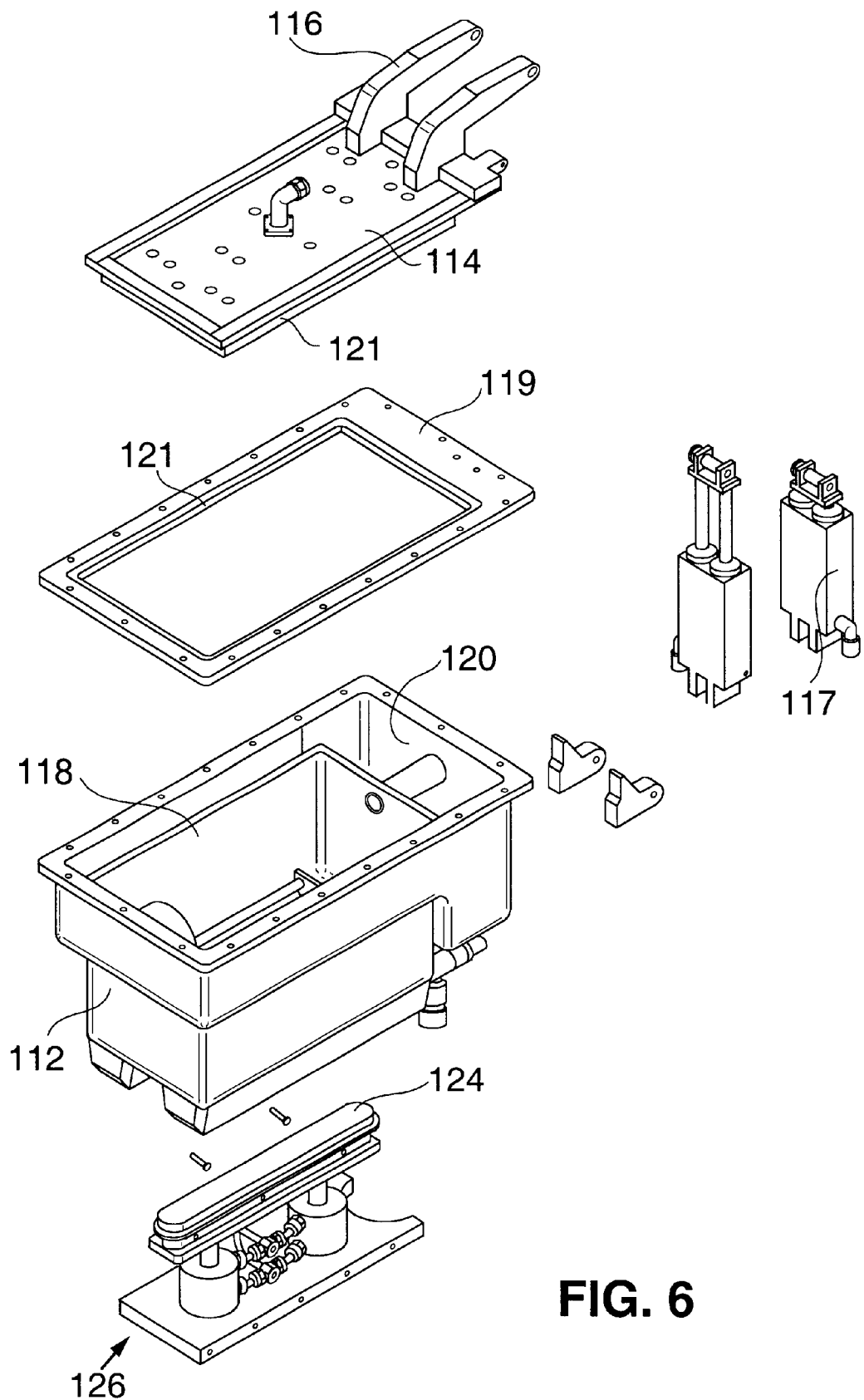
FIG. 6 is an exploded view of the drying vessel of FIG. 4A.
Figure 7:
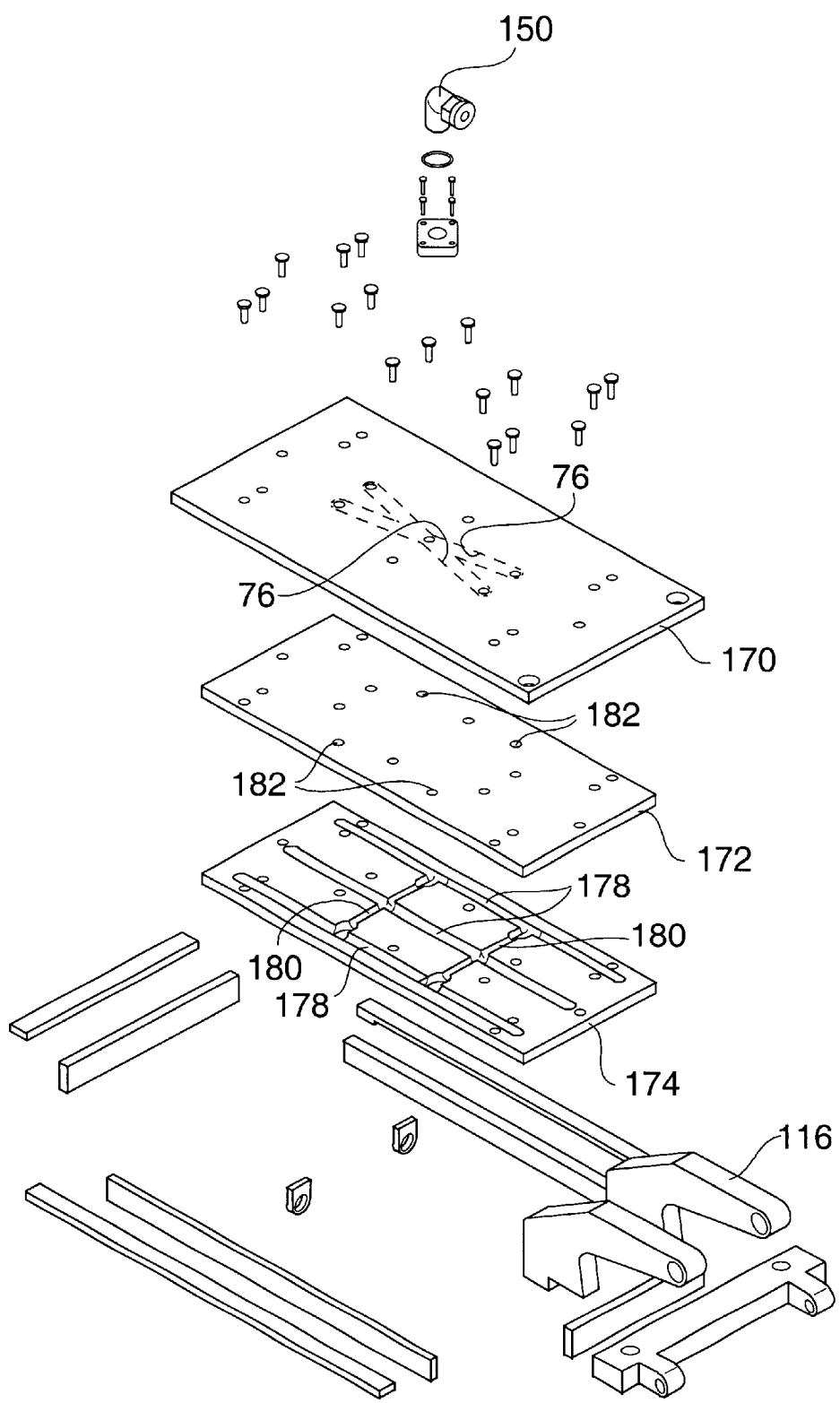
FIG. 7 is an exploded view of the lid for the drying vessel of FIG. 4A.

Referring to FIGS. 4A and 4B, the second embodiment includes a vessel 112 of any size and shape suitable for receiving and processing a batch of semiconductor wafers, and a lid 114 used to seal the interior of the vessel from the external environment. Vessel 112 and lid 114 are formed of materials, such as PVDF or PFA, which are inert to chemicals used in the process environment.

A vessel having the general characteristics of vessel 112 is the Dynaflow ™ rinse tank available from SCP Global Technologies, Boise Id. Vessel 112 is preferably formed of an inner tank section 118 surrounded at its side, front and rear walls by an overflow weir 120 for use with processes requiring process or rinse fluids to cascade over the vessel walls. Its walls are preferably serrated along their top edges to minimize fluid accumulation on the edges. Weir 120 has an interior bottom surface angled from the horizontal so as to facilitate flow of fluids towards a drain 122 positioned at one end of the weir 120. A conventional fill sensor (not shown) may be located within the vessel for use in confirming that liquid levels within the inner tank 118 are sufficiently high to completely immerse the wafers during use.

Pluralities of fluid inlets 136 are spaced longitudinally and laterally along the vessel bottom. A fluid line 134 connects a deionized water source to cavities 135 beneath the inlets. Fluid flowing from fluid line 134 into cavities 135 pressurizes the cavities, resulting in high pressure fluid flow through inlets 136 into vessel 112. The bottom wall of inner tank 118 preferably includes beveled side sections as shown in FIG. 4A to promote uniform fluid flow through the vessel from inlets 136.

As described with respect to the first embodiment, a chemical dispensing component is connected to the fluid line 134 to allow process chemicals to be injected into the DI stream when needed.

An elongate opening 123 is formed in the bottom wall of the inner tank section 118. Opening 123 extends longitudinally along the bottom wall from an area adjacent to the front of the tank to an area adjacent to the back of the tank. A dump door 124 seals the opening 123. An automatic dump door assembly 126 controls movement of the dump door 124 away from opening 123 to quickly empty inner section 118, and further controls movement of dump door 124 back into the opening 123 to re-seal the tank. A sensor of a type conventionally used with dump door assemblies may be provided to verify that the dump door has been opened or closed in accordance with instructions from the system controller.

When opened, the dump door permits quick discharge of fluids from the vessels into a catch basin 72 beneath the vessel. The system includes an exhaust and reclamation component that includes a waste line 74 that flows from the catch basin to an acid waste site within the foundry. A separate IPA disposal outlet 128 is positioned in an upper region of the discharge tank 72. During use, IPA vapor is exhausted (by $N_2$ gas flowing from inlet 150, through dump opening 123 and into the catch vessel 72) through outlet 128 to a condenser 132 where it is condensed for disposal.

The components of the system used to generate $N_2$ gas and drying vapor for delivery into the vessel are similar to those described above with reference to the first embodiment and so they will not be described again. These components are labeled in FIG. 4A using numbering that is consistent with their counterparts shown in FIG. 3 in connection with the first embodiment.

Vessel 112 includes a hinged lid 114. A pair of arms 116 extends from the lid 114. Each arm is coupled to a cylinder 117 having a lower end mounted to the stage or other support structure (not shown) used to hold the vessel in a process platform. Cylinders 117 are operative with arms 116 to pivot the lid between opened and closed positions. When in the closed position, lid seals against a flange 119 mounted on vessel 112 to prevent migration of fumes from the vessel and to further prevent particles from the surrounding environment from entering the vessel during use. To optimize sealing between the lid and the flange, one or more seals 121 (FIG. 6) formed of a suitable sealing material such as Teflon® or Chemraz, are positioned on lid 114 and/or flange 119.

A fitting 150 extends from the top of lid 114 and provides the inlet through which $N_2$ gas and IPA vapor enter the vessel. Lid 114 is provided with manifolding that promotes uniform flow of gas/vapor into the vessel and onto wafers situated within the vessel. This manifolding will be best understood with reference to FIG. 7. As shown, lid 114 is formed of a top plate 170, middle plate 172 and bottom plate 174. Formed in the underside of the top plate 170 are a pair of grooves 176 (see also FIG. 4A) that intersect to form an X-shaped pattern. Fitting 150 is fluidly coupled to the grooves, preferably at their intersection point, to direct gas/vapor passing through the fitting into the grooves.

Bottom plate 174 has a system of grooves 178, 180 on its upper surface. In one embodiment, the grooves include three longitudinal grooves 178 and a pair of lateral grooves 180. Longitudinal grooves 178 are lined with a plurality of small holes which are the entry points for $N_2$ and IPA vapor flowing from the lid 114 into the vessel 112.

Middle plate 172 is sandwiched between the top and bottom plates 170, 174. As can be seen in FIG. 4A, middle plate 172 forms a series of channels with the grooves 176, 178, 180 of the upper and lower plates. In other words, the arrangement of the plates creates a pair of channels (intersecting to form an X-shape) between the top and middle plates, and another series of channels between the middle and lower plates.

Middle plate includes throughholes 182 that extend between its upper and lower surfaces. Throughholes 182 provide a path through which $N_2$ gas and IPA vapor flow from the X-shaped channel system, through the middle plate, and into the series of channels formed between lower plate grooves 178, 180.

To facilitate distribution of $N_2$ and IPA vapor through lid 114, throughholes 182 may be aligned with the four corners of the "X" formed by the two grooves of the top plate and with the intersection points between longitudinal channels 178 and lateral channels 180 on lower plate 174. During use, the gas/vapor flows through fitting 150 into the X-shaped channels formed between the top and middle plates, then through throughholes 182 into the system of channels formed between the middle and bottom plates. Ultimately, the gas/vapor flows into the vessel through the small openings formed in the longitudinal grooves 180.

A process controller 184 is electronically coupled to the lid robotics, dump door assembly 126, chemical injection component 68 and the various valves and sensors associated with operation of the system. Controller 184 is programmed to govern control and timing of these components to automatically open and close the valves, activate the lid and dump door, and regulate flow of fluids and gases etc. in accordance with a process recipe appropriate for the treatment process being carried out. A controller suitable for this purpose is a MCS microprocessor controller available from Preco Electronics, Inc. Boise, Id. However, any suitable process control computer can be used. It should be noted that the electronic coupling between the controller and associated components is not represented in the drawings only for reasons of clarity.

Figures 9A, 9B:
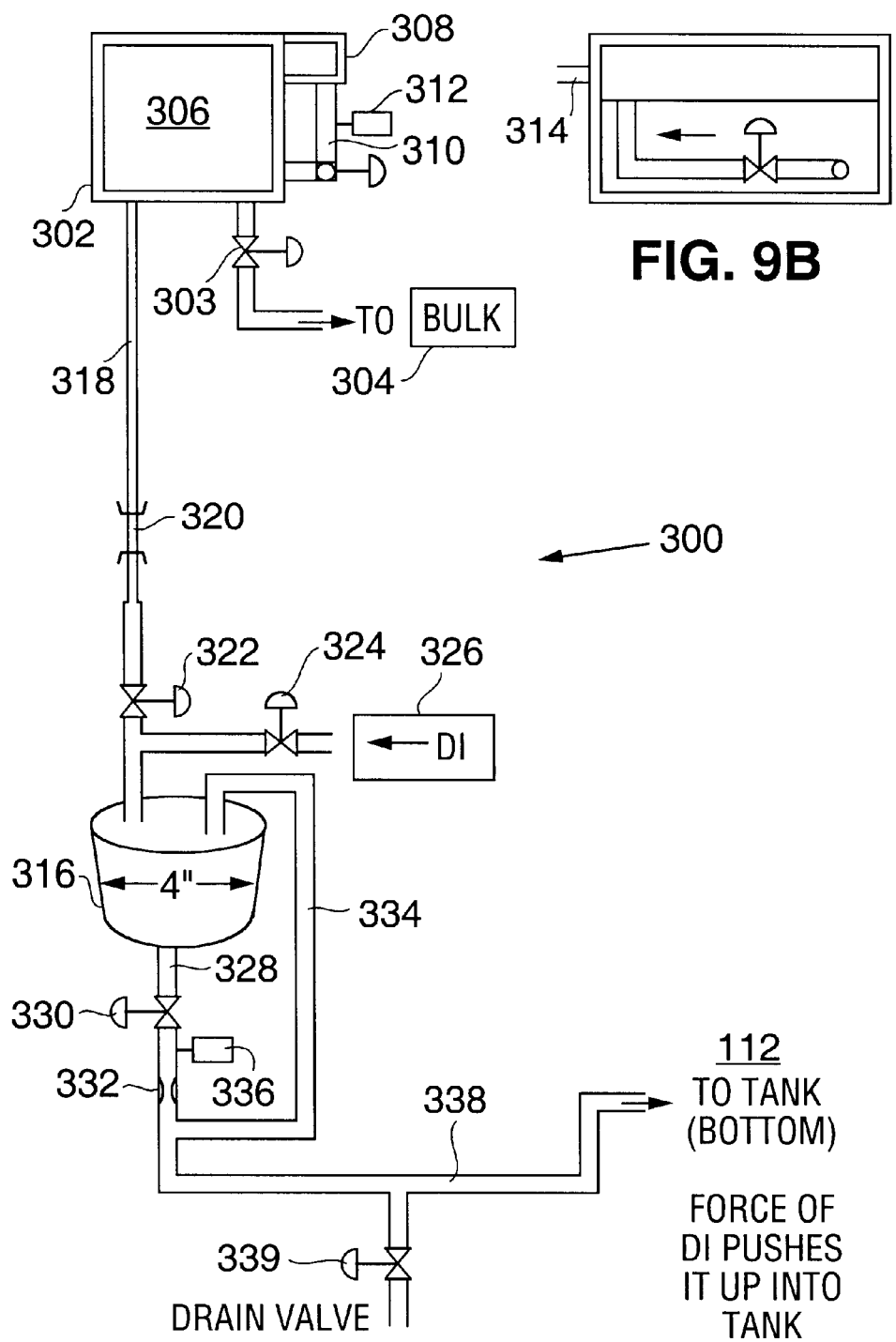
FIG. 9A is a schematic representation of a chemical injection system useful in connection with the first and second embodiments, the figure includes a front elevation view of the chemical storage vessel.
FIG. 9B is a side elevation view of the chemical storage vessel of the chemical injection system of FIG. 9A.

A chemical injection system 300 useful as the chemical injection component 68 for the system of the first and second embodiments in shown in FIGS. 9A and 9B. Chemical injection system 300 is a desirable one in that it permits precise measurement of process chemicals despite the variations in pressure that are inherent to the bulk chemical supplies typically used at foundries. Timing and control of the various valves utilized by the chemical injection system is governed by process controller 184 or by a separate controller.

Referring to FIG. 9A, chemical injection system 300 includes a chemical storage vessel 302 coupled to a bulk chemical supply 304. Chemical storage vessel includes a main chamber 306 and a side chamber 308 extending from the main chamber. The interiors of the main and side chambers are contiguous with one another. In addition, a fluid line 310 extends between the main and side chambers.

A liquid level sensor 312 is positioned to monitor the liquid level in fluid line 310 and to provide feedback concerning the liquid level to system controller 184 (FIG. 4A). A vent 314 extends from a wall of the primary vessel.

A dispense vessel 316 is coupled to chemical storage vessel 302 by line 318, which includes reduced flow orifice 320. A valve 322 is positioned downstream of orifice 320, and a DI line joins line 318 further downstream of valve 322. A valve 324 governs flow of DI water from DI source 326 into vessel 316.

An outlet line 328 extends from dispense vessel 316 and includes a valve 330 and a reduced flow orifice 332. Liquid level sensor 336 is positioned in line 328 to detect when fluid is present in line 328 (i.e. once valve 330 has been opened).

A side branch 334 connects outlet line 328 with an upper section of vessel 316. Further downstream of side branch 334 is a dispensing line 338 fluidly coupled with the vessel 112.

There are four general steps involved during operation of chemical injection system 300. The first is the bulk fill step, in which chemical storage vessel 302 is filled with chemical from bulk supply 304. The second is timed secondary fill step, in which the amount of chemical needed to treat a batch of wafers is passed from chemical storage vessel 302 into dispense vessel 316. The secondary fill step is accomplished by opening valve 322 for a period of time predetermined to cause the desired volume to be dispensed into vessel 316. Third, valve 330 is opened to allow the chemical from vessel 316 into line 338. As will be discussed in detail, this step is timed and utilizes sensor 336 to verify the accuracy of the secondary fill step. Finally, a dispensing step is carried out in which the chemical is carried from line 338 into the process tank by a DI stream passing into and through vessel 316.

The bulk fill step is typically carried out when the volume of the chemical storage vessel 302 has decreased to a predetermined minimum level. Valve 303 which lies between vessel 302 and bulk supply is opened, causing chemical to flow from the bulk supply into vessel 302. All other valves in the system remain closed throughout the bulk fill step.

Fill sensor 312 is configured to provide feedback to controller 184 indicating that the fluid level in chemical storage vessel 302 has reached a predetermined level. The level will preferably be selected to correspond to the volume of chemical needed to treat a predetermined number of wafer batches in vessel 112.

Once fill sensor 312 detects that chemical storage vessel 302 has been filled to the desired volume, valve 303 is closed. Next, valve 322 is opened to initiate the secondary fill step into vessel 316. The system allows an accurate fill of vessel 316 by monitoring the time for which valve 322 has been opened. For example, the flow rate of the system may be such that it takes four minutes to dispense 200 ml into the vessel 316. Once valve 322 has been opened for the required duration, it is closed, thereby halting fluid flow into vessel 316. Reduced flow orifice 320 causes fluids dispensed into dispense vessel 316 to flow slowly, so as to insure a high level of accuracy during the secondary fill step by minimizing the effect of the split second delay between issuance of the "close" control signal to valve 322 and the actual closing of the valve. It should be noted that the system is useful for applications in which successive runs of the system require different dispense volumes. Simply changing the amount of time for which valve 322 will be opened during the secondary fill step can change the volume of chemical that will be dispensed.

After valve 322 has been closed, valve 330 is opened to permit chemical to flow from dispense vessel 316 into dispense plumbing 338, which is preferably large enough to contain the entire dispense volume. Once line 328 has been emptied, sensor 336 turns off, indicating that vessel 316 has been completely evacuated. The system registers the time lapsed between the opening of valve 330 and the turning off of sensor 336, which is the amount of time taken to empty vessel 316. The measured time is compared by the system to a value saved in the system's software correlating to the amount of time that it should take for the desired dispense volume to exit vessel 316 given the known rate at which fluid will flow from vessel 316. This step is done in order to verify the initial time dispense into vessel 316. If the comparison reveals a possible error in the amount of chemical dispensed, remedial measures are taken before wafers are transferred into vessel 112. Such remedial measures may include disposing of the chemical via drain valve 339 and repeating the secondary fill step.

Shortly afterwards, when it is time to dispense chemical into the vessel 112, valve 324 is opened, causing DI water to flow from source 326, into dispense vessel 316, and then into plumbing 338 via lines 328 and 334. Because of the positioning of reduced flow orifice 332 in line 328, only a small portion of the DI water flows through line 328 where it serves to rinse chemical from the line. A larger percentage of the DI fills the vessel 316 and flows through side branch 334 into line 338, pushing the chemical in line 338 into tank 112 while also rinsing vessel 316 and lines 334 and 338. Control over the volume of DI water dispensed can be carried out by keeping valve 324 opened for a predetermined amount of time known to result in dispensing of the desired volume, or by closing valve 324 in response to feedback from a liquid level sensor in the vessel 340.

Figure 10:
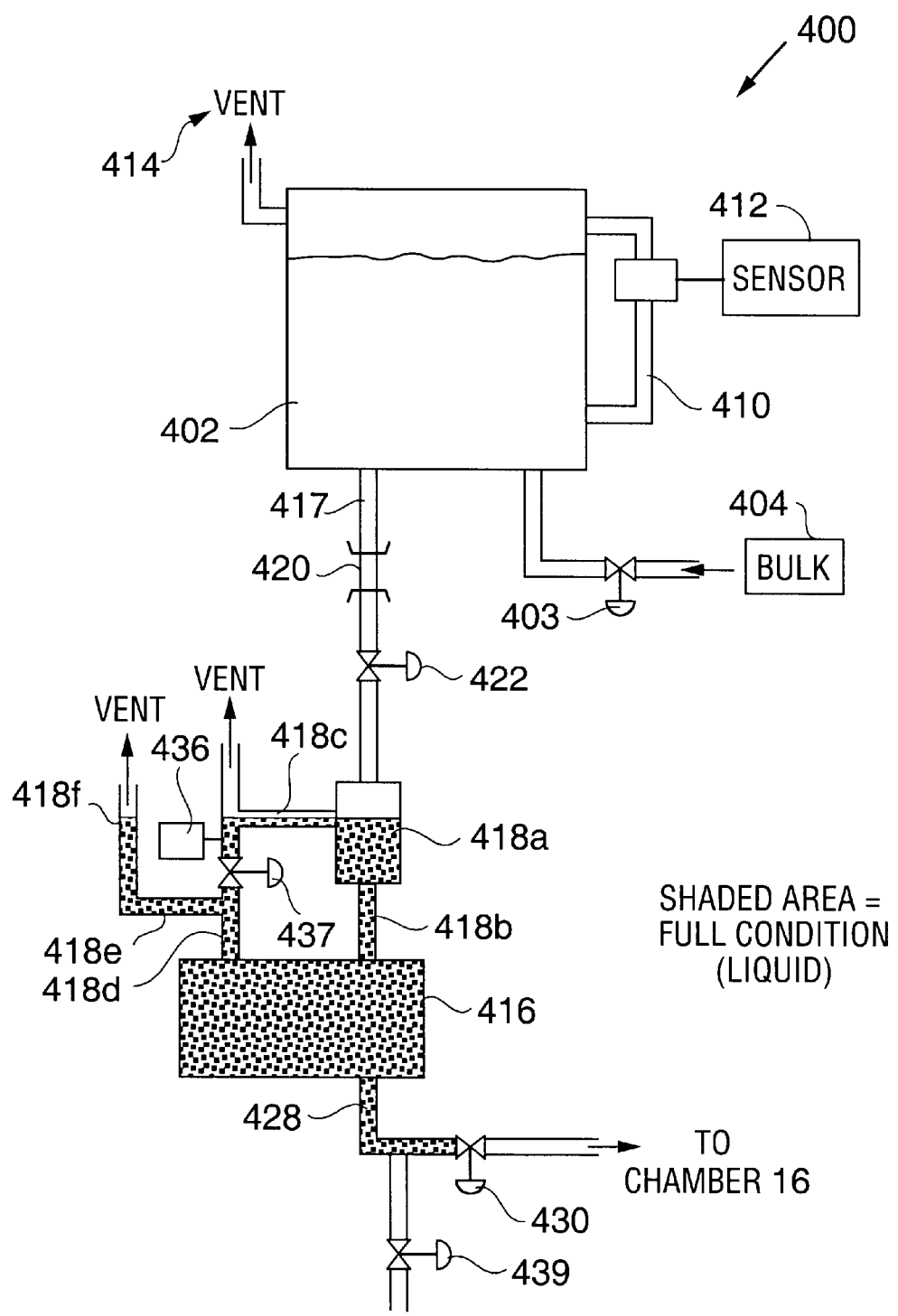
FIG. 10 is a schematic representation of a chemical injection system useful in connection with the first and second embodiments, and particularly for use in dispensing a drying compound into drying vapor generation chamber.

FIG. 10 shows a chemical injection system 400 useful for dispensing drying compound (such as IPA or another suitable compound) into the drying vapor generation chamber (chamber 16, FIGS. 2 and 4A). Chemical injection system 400 includes a chemical storage vessel 402 coupled to a bulk supply of drying compound 404. A fluid line 410 extends between upper and lower portions of vessel 402. A liquid level sensor 412 is positioned to monitor the liquid level in fluid line 410 and to provide feedback concerning the liquid level to system controller 184 (FIG. 4A). A vent 414 extends from a wall of vessel 402.

A dispense vessel 416 is coupled to chemical storage vessel 402 by a system of plumbing formed of line 417, reservoir 418a, and lines 418b through 418f. A reduced flow orifice 420 is positioned in line 417 and a valve 422 is positioned downstream of orifice 420.

The opening in reservoir 418a at its connection with line 418c is significantly smaller than the diameter of the pipe forming line 418c. For example, reservoir 418a may include a ½-inch diameter opening leading to a 1-inch diameter line 418c. Lines 418d and 418f have vents at their upper ends. A sensor 436 is located in line 418d and a valve 437 is positioned below sensor 436.

Vessel 416 and its associated plumbing 418a–f are proportioned to contain and precisely dispense the entire quantity of chemical needed for a single dispense operation. They are arranged such that detection of a fluid level by sensor 436 occurs when dispense vessel 416 and its associated plumbing has been filled with slightly more than the required volume of chemical for the process. Dispense vessels and plumbing of different volumes may be used to replace vessel 416 and its plumbing when different dispense volumes are needed.

A dispensing line 428 extends from dispense vessel 416 and includes a valve 430. Dispensing line 428 is fluidly coupled with drying vapor generation chamber 16 for dispensing a drying compound into the chamber for vaporization.

There are three general steps involved during operation of chemical injection system 400. The first is the bulk fill step, in which chemical storage vessel 402 is filled with chemical drying compound from bulk supply 404. The second is a secondary fill step, in which the amount of chemical needed for use in drying a batch of wafers is passed from storage vessel 402 into dispense vessel 416 and its plumbing.

Third, valve 430 is opened to allow the chemical from vessel 416 and its plumbing into chamber 16.

The bulk fill step is typically carried out when the volume of the chemical storage vessel 402 has decreased to a predetermined minimum level. Valve 403 is opened, causing chemical to flow from the bulk supply into the vessel. Valve 422 remains closed throughout the bulk fill step.

Fill sensor 412 is configured to provide feedback to controller 184 indicating that the fluid level in chemical storage vessel 402 has reached a predetermined level. The level will preferably be selected to correspond to the volume of chemical needed to carrying out a predetermined number of drying procedures.

Once fill sensor 412 detects that chemical storage vessel 402 has been filled to the desired volume, valve 403 is closed. Next, valve 422 is opened to initiate the secondary fill step into vessel 416. It should be noted that valve 437 in line 418d remains closed during the secondary fill.

During the secondary fill, fluid flows through orifice 420, filling the portion of line 428 that lies upstream of valve 430, then filling vessel 416, line 418b and then reservoir 418a. Next, fluid cascades from reservoir 418a into line 418c and into the portion of line 418d that sits above closed valve 437. Fluid also rises from vessel 416 into the portion of line 418d that lies below valve 437, and flows into lines 418e and 418f. When sensor 436 detects a fluid level, the calibrated fluid volume has been achieved. In response, valve 422 is closed, thereby halting fluid flow into vessel 416. Shading in FIG. 10 represents the calibrated volume of fluid at the end of the secondary fill step.

After valve 422 has been closed, valve 430 is opened to permit chemical to flow from dispense vessel 416 into chamber 16. It should again be noted that at this stage valve 437 remains closed.

After valve 430 has been opened for a predetermined amount of time known to dispense the calibrated volume of chemical, it is closed. Because valve 437 remains closed during the secondary fill, a small volume of fluid remains in line 418c and in the portion of line 418d that is above valve 437. Valve 437 is next opened to allow this small volume of fluid to flow into vessel 416 where it will form a portion of the calibrated volume measured during the following secondary fill step. This small volume corresponds to the amount of volume over the required process volume that will enter the system as a result of the inability of valve 422 to close instantaneously when sensor 436 detects a liquid level.

OPERATION

Second Embodiment

Operation of the second embodiment will next be described with reference to FIG. 3 and in the context of a process in which oxidation is removed using an HF/HCI etch, and in which the wafers are subsequently rinsed, and dried. In a preferred embodiment, the described sequence of steps occurs automatically in accordance with a process recipe pre-programmed into controller 184. In other words, management of the chemical processing times, rinse times, vessel evacuation times, flow rates, waste disposal, chemical measurement, dispensing and injection etc. is governed by process controller 184.

IPA vapor generation is preferably carried out in the early stages of the process, but in any event prior to the moment at which the wafers are ready for drying. IPA vapor is created within the IPA chamber 16 by injecting a pre-measured quantity of IPA liquid onto heated surface 60 of chamber in the manner discussed with reference to chemical injection system 400 (FIG. 10). In one embodiment, the amount of IPA utilized for a batch of fifty 200-mm diameter wafers is approximately 50–150 ml. The IPA is heated on surface 60 to a temperature preferably less than the boiling point of IPA (which is 82.4°C. at 1 atmosphere). Heating the IPA increases the rate at which IPA vapor is generated and thus expedites the process, creating a dense IPA vapor cloud. Maintaining the IPA temperature below boiling prevents impurities in the IPA liquid from becoming airborne where they are apt to be carried into contact with the wafers.

To begin processing, vessel 112 is filled with an etch solution of DI water and etch chemicals (for example, HF and HCI). For more even mixing, the etch chemicals may be injected into the DI stream as it flows into the vessel as discussed in connection with the chemical injection system 300 (FIGS. 9A and 9B).

With lid 114 opened, a wafer cassette carrying wafers W is lowered into the vessel and positioned on a wafer support within the vessel. Lid 114 is next pivoted into a closed position, causing the vessel to be sealed by seal 121. $N_2$ gas (preferably at room temperature) from a source 66 (which may, but need not be, the same as source 54) is introduced into the vessel via fixture 150 to purge the system of air. Ambient $N_2$ continues to flow into the vessel at a low flow rate until drying begins as later described.

After the wafers have been etched, rinse fluid is pumped into the vessel 112 via DI inlets 136, and cascades into the overflow weir 120 and out the drain 122. If an ozone rinse is desired, the wafers are next rinsed using ozonated DI water. This may be carried out by injecting ozone into the rinse water via a separate inlet in the vessel 112, or directly into the DI stream by the chemical dispensing component. Rinsing continues for a sufficient period of time (for example, 3–5 minutes, but will vary with applications) to thoroughly rinse the wafers and cassette. After the desired rinse time, the dump door assembly quickly is activated to move the dump door 124 to its opened position to quickly discharge the rinse fluid from the vessel ("quick dump"). Preferably complete evacuation of the fluid in the vessel occurs in a very short time, and preferably in less than 5 seconds. The discharged fluid moves into catch basin 72, then drains from catch basin 72 into the foundry's acid waste disposal via waste line 74. Low flow ambient $N_2$ continues flowing into the vessel during the quick dump step.

Just prior to the drying step, valve 56 is briefly opened, permitting heated $N_2$ gas to fill the IPA generation chamber 16, which already contains the rich IPA vapor cloud as discussed above. Once the liquid in the vessel has been fully discharged, valve 59 is opened, causing the heated $N_2$ (having a temperature of typically 80–90° C.) to carry the IPA vapor into the vessel. The IPA and nitrogen utilized in the process are preferably high purity, such as "ppb" or parts per billion quality or 99.999% pure.

The $N_2$/IPA flows into the vessel at a rate of approximately 25–100 standard liters per minute (slpm) for an IPA drying period preferably 2–5 minutes. The lower end of this range is preferred in that is leads to lower IPA emissions. The manifold arrangement in the lid 114 promotes even distribution of IPA vapor through the channels in the lid and consequently an even flow of vapor through the inlets and onto the wafers.

The IPA vapor condenses on the wafers, forming a uniform concentration of IPA in the liquid adhering to the wafer surface. The condensed IPA breaks the surface tension of water on the wafers and causes the rinse water to shear off of the wafer surfaces. By the end of the IPA drying period, the rinse water will have been completely removed from the waters, cassette, and vessel walls, and will have been replaced by a layer of condensed IPA. The $N_2$/IPA exits the vessel through dump opening 123 into catch basin 72, where it is exhausted through line 128, passed through condenser 132, and disposed of.

The quick dump and IPA vapor steps as described herein provide several advantages over the prior art. One advantage provided over conventional vapor dryers is that the wafers remain in a purged environment within vessel 112 throughout the entire process, rather than being exposed to oxygen and particles as they are moved from a rinse vessel to a drying vessel. Other advantages will be appreciated with reference to FIGS. 8A–8C. Referring to FIG. 8A, after the quick dump is performed, a carry over layer of water remains on the wafer surface. When IPA vapor begins to enter vessel 112, it condenses on the surface of this carry-over layer and diffuses into the water layer. As more IPA condenses on the water, it gradually decreases the surface tension of the water until the water eventually falls from the wafer surface. IPA vapor continues to enter the vessel 112 and condenses on the wafer surface, leaving a layer of condensed IPA on the wafer surface (FIG. 8B).

This method of water removal is particularly beneficial for wafers having high aspect ratios or severe topography, where many tight spaces exist within the wafer surface. Capillary forces are high in such tight spaces and it is thus difficult to remove water from them. The method of condensing IPA onto the carry over layer of water where it can work its way into the water and then into the wafer's tight geometries (and continuing to condense onto the wafer surface after the carryover layer has fallen from the wafer) facilitates drying even in those deeply or tightly-patterned regions.

Moreover, the flow of condensed water and condensed IPA from the wafer surfaces promotes IPA/water rinsing of the wafer surfaces which facilitates removal of any particles that may remain on the wafers.

Another advantage lies in that the quick dump step is performed so as to completely evacuate the vessel 112 (or at least to drain fluid in the vessel to below the wafers) in a very short period of time, preferably under five seconds. This high velocity draining of the liquid is beneficial to stripping water (and any particles in the water) off the surfaces of the wafers. It thus facilitates water removal even before the IPA vapor step is initiated.

Returning to FIGS. 3 and 4A, at the end of the IPA drying period, valve 59 is closed, and bypass valve 58 is opened, causing heated $N_2$ (preferably 80°–90° C.) to flow directly into the vessel at a higher flow rate of preferably 150–250 slpm. As with the first embodiment, additional gas inlets may be positioned within the vessel and oriented to direct the gas onto the cassette to facilitate drying during this step.

Figure 8C:
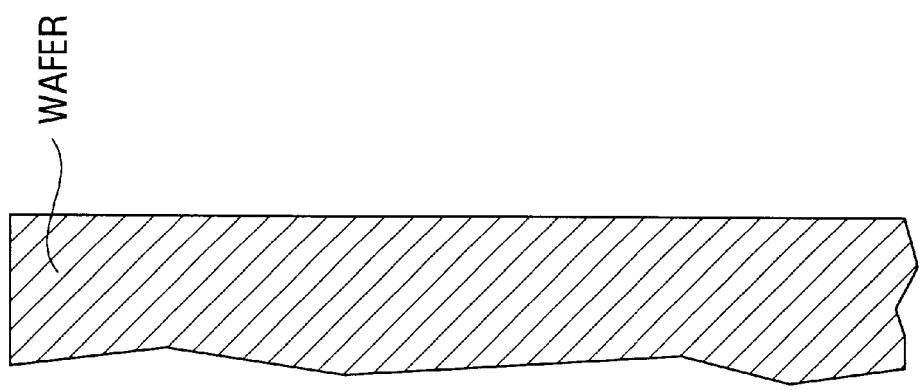
FIGS. 8A–C are side elevation views of a wafer schematically sequentially illustrating the process of removing rinse water and condensed IPA from the surface of the wafer as described with respect to the first and second embodiments.
Figure 8B:
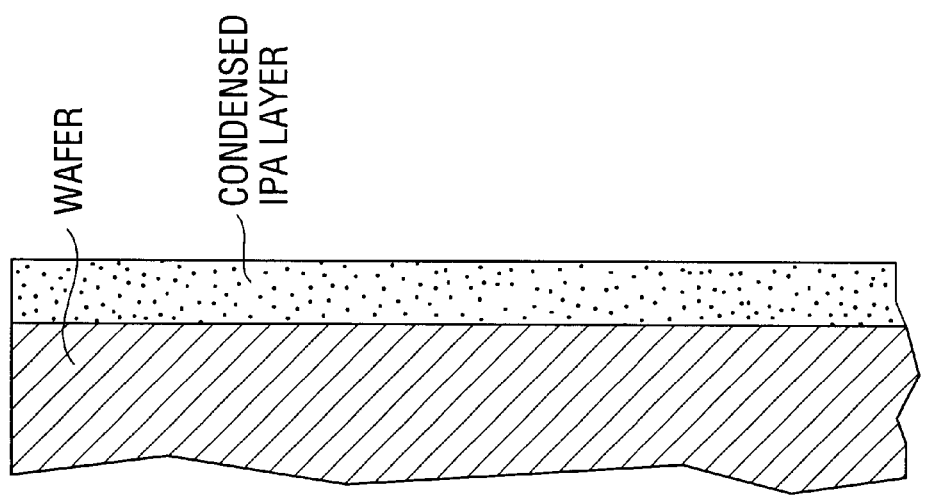
Figure 8A:
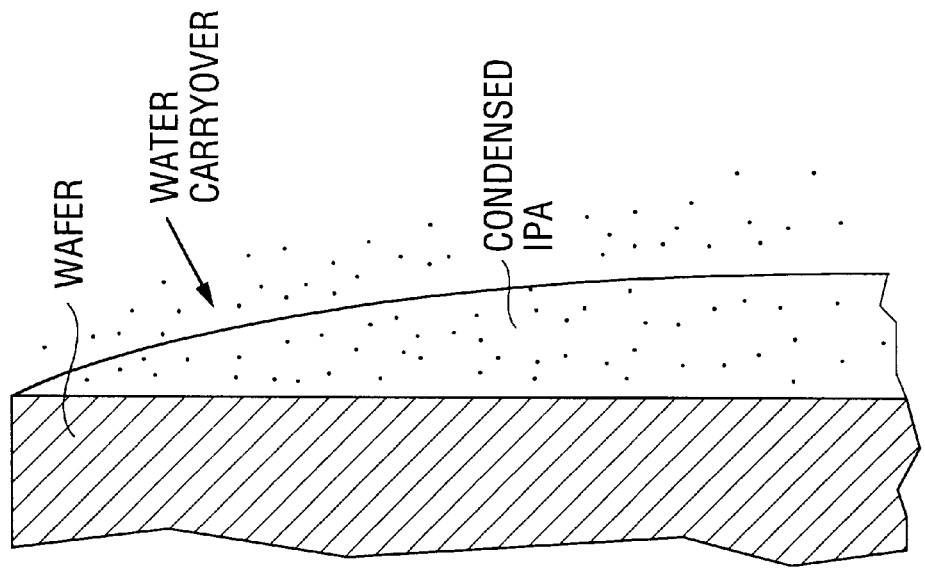

The heated N₂ gas removes the condensed IPA from the wafers, cassette and vessel walls by evaporation (FIG. 8C). This IPA evaporation step is preferably carried out for approximately 2–5 minutes. The evaporated IPA is exhausted through IPA drain 128 into condenser 130. Condenser 130 condenses the IPA to a liquid form suitable for disposal. The heated N₂ gas additionally purges any IPA vapor remaining in the vessel into catch basin 72 and through condenser 132 via line 128.

At the end of the IPA evaporation step, a low flow (preferably 20 slpm) of N₂ gas is resumed to maintain a clean environment within the vessel during removal of the wafers. Lid 114 is opened and the fully dried wafers and cassette are removed from the vessel.

As discussed, the system 110 is useful for other processes, as well. For example, the system 110 may be utilized as a component of a larger system in which wafers are processed and rinsed in a separate vessel. For an operation of that type, use of the system 110 might begin just after the rinse steps, with wet wafers being lowered into the vessel 112 for drying. As another example also illustrated in FIG. 8, for certain surfaces it may be desirable to skip the HF last step and to use the system to carry out an ozone rinse/rinse/dry process. An ozone rinse produces a hydrophilic surface on the wafer, whereas the HF last process described above produces a hydrophobic surface. The drying process described herein is beneficial in that it works well regardless of whether the wafer surface is hydrophilic or hydrophobic.

As yet another example, immersion of the wafers in HF may be immediately followed by a quick dump of the HF solution into the catch basin. The chemical quick dump is followed by the IPA vapor drying step (step 218) and, if needed, the subsequent hot N₂ step to remove condensed IPA from the wafers and cassette.

While the subject invention has been described with reference to preferred embodiments, various changes and modifications could be made therein, by one skilled in the art, without varying from the scope and spirit of the subject invention as defined by the appended claims.

We claim:

1. A method of treating and drying the surface of an object, comprising the steps of:
   (a) providing a system containing a vessel and at least one object having a surface;
   (b) immersing the object in a process fluid in the vessel;
   (c) performing a quick dump to discharge the process fluid from the vessel, leaving residual process fluid on the surface of the object;
   (d) after discharging the process fluid from the system, introducing a drying vapor into the vessel, the drying vapor condensing on the surface of the object and reducing the surface tension of the residual process fluid, causing the residual process fluid to flow off of the surface, and exhausting the drying vapor from the system.

2. The method of claim 1 wherein the process fluid is deionized water.

3. The method of claim 1 wherein the process fluid is hydrofluoric acid.

4. The method of claim 1, further including the step of introducing a heated gas into the vessel after step (d) to volatilize condensed drying vapor from the surface.

5. A method of treating and drying the surface of an object, comprising the steps of:
   (a) providing a vessel and at least one object having a surface;
   (b) immersing the object in a process fluid in the vessel;
   (c) discharging the process fluid from the vessel, leaving residual process fluid on the surface of the object;
   (d) prior to step (b), generating a drying vapor at a location remote from the vessel; and
   (e) after discharging the process fluid from the vessel, introducing a drying vapor into the vessel using a carrier gas to carry the drying vapor from the remote location into the vessel, the drying vapor condensing on the surface of the object and reducing the surface tension of the residual process fluid, causing the residual process fluid to flow off of the surface.

6. The method of claim 5 wherein:
   step (a) further provides a chamber fluidly coupled to the vessel, the chamber positioned remotely from the vessel;
   the generating step includes the step of heating a drying compound within the chamber to produce the drying vapor; and
   step (e) includes passing the carrier gas through the chamber to cause it to carry the drying vapor into the vessel.

7. The method of claim 1, wherein the method further includes the step of reclaiming drying vapor from the vessel and condensing the reclaimed drying vapor to a liquid form.

8. The method of claim 1 wherein the drying vapor is formed from isopropyl alcohol.

9. A method of treating and drying the surface of an object, comprising the steps of:
   (a) providing a system containing a vessel and at least one object having a surface;
   (b) immersing the object in a liquid chemical within the vessel to treat the object;
   (c) introducing a rinse fluid into the vessel to rinse the chemical from the vessel and from the surface of the object;
   (d) performing a quick dump to discharge the rinse fluid from the vessel leaving residual rinse fluid on the surface of the object; and
   (e) after discharging the rinse fluid from the vessel, introducing a drying vapor into the vessel, the drying vapor, the drying vapor condensing on the surface of the object and reducing the surface tension of the residual rinse fluid, causing the residual rinse fluid to flow off of the surfaces, and exhausting the drying vapor from the system.

10. The method of claim 9 further including the step of introducing a heated gas into the vessel after step (e) to volatilize condensed drying vapor from the surface.

11. A method of treating and driving the surface of an object, comprising the steps of:
    (a) providing a vessel and at least one object having a surface;
    (b) immersing the object in a liquid chemical within the vessel to treat the object;
    (c) introducing a rinse fluid into the vessel to rinse the chemical from the vessel and from the surface of the object;
    (d) discharging the rinse fluid from the vessel, leaving residual rinse fluid on the surface of the object;
    (e) prior to step (b), generating a drying vapor at a location remote from the vessel; and (f) after discharging the rinse fluid from the vessel, introducing a drying vapor into the vessel using a carrier gas to carry the drying vapor from the remote location into the vessel, the drying vapor condensing on the surface of the object and reducing the surface tension of the residual rinse fluid, causing the residual rinse fluid to flow off of the surfaces.

12. The method of claim 11 wherein step (a) further provides a chamber fluidly coupled to the vessel, the chamber positioned remotely from the vessel;

the generating step includes the step of heating a drying compound within the chamber to produce the drying vapor; and step (f) includes passing the carrier gas through the chamber to cause it to carry the drying vapor into the vessel.

13. The method of claim 9, wherein the method further includes the step of reclaiming drying vapor from the vessel and condensing the reclaimed drying vapor to a liquid form.

14. The method of claim 9 wherein the drying vapor is formed from isopropyl alcohol.

15. The method of claim 9 wherein the rinse fluid is deionized water.

16. A method of treating and drying the surface of an object, comprising the steps of:

(a) providing a vessel and at least one object having a surface;

(b) immersing the object in a liquid chemical within the vessel to treat the object;

(c) introducing a rinse fluid into the vessel to rinse the chemical from the vessel and from the surface of the object;

(d) discharging the rinse fluid from the vessel, leaving residual rinse fluid on the surface of the object;

(e) after discharging the rinse fluid from the vessel, introducing a drying vapor into the vessel, the drying vapor condensing on the surface of the object and reducing the surface tension of the residual rinse fluid, causing the residual rinse fluid to flow off of the surfaces; wherein the method includes the step of rinsing the objects in ozonated rinse fluid.

17. The method of claim 16, wherein the step of rinsing the object with ozonated rinse fluid is performed prior to step (d).

18. A method of treating and drying the surface of an object, comprising the steps of:

(a) providing a vessel, a remote chamber fluidly coupled to but remote from the vessel, and at least one object having a surface;

(b) treating the object using a wet processing procedure outside the vessel, to produce a wet object having residual process fluid thereon;

(c) positioning the wet object in the vessel;

(d) generating a drying vapor in the chamber; and (e) passing a carrier gas through the chamber into the vessel, the carrier gas carrying the drying vapor from the chamber into the vessel, the drying vapor condensing on the surface of the object and reducing the surface tension of the residual process fluid, causing the residual process fluid to flow off of the surface.

19. The method of claim 18 wherein step (d) includes heating a drying compound within the chamber to produce the drying vapor.

20. The method of claim 19 wherein the drying compound is heated to a temperature below its boiling point.

21. The method of claim 18, wherein:

step (a) further provides a lid for the vessel, the lid including at least one inlet;

the method further includes the step of sealing the vessel using the lid; and in step (e) the carrier gas and drying vapor are passed into the vessel via the at least one inlet in the lid.

22. The method of claim 19 wherein the drying compound is isopropyl alcohol.

23. The method of claim 18, wherein the method further includes the step of reclaiming drying vapor from the vessel and condensing the reclaimed drying vapor to a liquid form.

24. The method of claim 18, further including the step of introducing a heated gas into the vessel after step (e) to volatilize condensed drying vapor from the surface.

25. A method of treating and drying the surfaces of a semiconductor substrate, comprising the steps of:

(a) providing a vessel and at least one semiconductor substrate having a surface;

(b) immersing the semiconductor substrate in a chemical treatment solution in the vessel;

(c) discharging the treatment solution from the vessel;

(d) after the treatment solution has been fully discharged from the vessel and without first rinsing the semiconductor substrate, introducing a drying vapor into the vessel, the drying vapor condensing on the surface of the semiconductor substrate and reducing the surface tension of the residual treatment solution causing the residual treatment solution to flow off of the surfaces.

26. The method of claim 25, further including the step of introducing a heated gas into the vessel after step (d) to volatilize condensed drying vapor from the surface.

27. A method of treating and drying the surfaces of an object, comprising the steps of:

(a) providing a vessel and at least one object having a surface;

(b) immersing the object in a treatment solution in the vessel, the treatment solution including hydrofluoric acid;

(c) discharging the treatment solution from the vessel;

(d) prior to step (b), generating a drying vapor at a location remote from the vessel; and (e) after the treatment solution has been fully discharged from the vessel and without first rinsing the object, introducing a drying vapor into the vessel using a carrier gas to carry the drying vapor from the remote location into the vessel, the drying vapor condensing on the surface of the object and reducing the surface tension of the residual treatment solution causing the residual treatment solution to flow off of the surfaces.

28. The method of claim 27 wherein step (a) further provides a chamber fluidly coupled to the vessel, the chamber positioned remotely from the vessel;

the generating step includes the step of heating a drying compound within the chamber to produce the drying vapor, and wherein step (e) includes passing the carrier gas through the chamber to cause it to carry the drying vapor into the vessel.

29. The method of claim 28, wherein the method further includes the step of reclaiming drying vapor from the vessel and condensing the reclaimed drying vapor to a liquid form.

30. The method of claim 25 wherein the drying vapor is formed from isopropyl alcohol.

31. The method of claim 25 wherein:
step (a) further provides a lid for the vessel, the lid including at least one inlet;
the method further includes the step of sealing the vessel using the lid; and
in step (d) the carrier gas and drying vapor are passed into the vessel via the at least one inlet in the lid.

32. A method of treating and drying an object, comprising the steps of:
(a) providing a system containing a vessel having a moveable lid, the lid formed of a plurality of walls joined together to form a bottomless enclosure, and further providing an object having a surface;
(b) immersing the object in a process fluid in the vessel;
(c) sealing the vessel using the lid;
(d) heating at least a portion of the lid to a temperature above that of the process fluid;
(e) discharging the process fluid from the vessel, leaving residual process fluid on the surface of the object; and
(f) after the process fluid has been fully discharged from the vessel, introducing a drying vapor into the vessel, condensing on the surface of the object and reducing the surface tension of the residual process fluid, causing the residual process fluid to flow off of the surface, and exhausting the drying vapor from the system.

33. A method of treating and drying an object, comprising the steps of:
(a) providing a vessel having a moveable lid, the lid formed of a plurality of walls joined together to form a bottomless enclosure, and further providing an object having a surface;
(b) prior to step (c) suspending the lid above the vessel, immersing the object in a chemical bath in the vessel, then discharging the chemical from the vessel after immersing the object, and then sealing the vessel using the lid;
(c) immersing the object in a rinse fluid in the vessel;
(d) sealing the vessel using the lid;
(e) heating at least a portion of the lid to a temperature above that of the process fluid;
(f) discharging the process fluid from the vessel, leaving residual process fluid on the surface of the object; and
(g) after the process fluid has been fully discharged from the vessel, introducing a drying vapor into the vessel, the drying vapor condensing on the surface of the object and reducing the surface tension of the residual process fluid, causing the residual process fluid to flow off of the surface.

34. The method of claim 33 wherein the step of suspending the lid above the vessel creates a hood above the vessel for minimizing escape of fumes from the vessel into the surrounding atmosphere.

35. The method of claim 32 wherein the lid is provided to have at least one inlet, and wherein step (f) includes introducing the drying vapor into the vessel via the inlet in the lid.

36. The method of claim 32, further including the step of introducing a purging gas into the vessel prior to introducing the drying vapor.

37. The method of claim 32, further including the step of introducing a heated gas into the vessel after step (f) to volatilize condensed drying vapor from the surface of the object.

38. The method of claim 1 wherein the object is a wafer substrate.

39. The method of claim 5 wherein the object is a wafer substrate.

40. The method of claim 5 wherein the process fluid is deionized water.

41. The method of claim 5 wherein the process fluid is hydrofluoric acid.

42. The method of claim 5, further including the step of introducing a heated gas into the vessel after step (d) to volatilize condensed drying vapor from the surface.

43. The method of claim 5, wherein the method further includes the step of reclaiming drying vapor from the vessel and condensing the reclaimed drying vapor to a liquid form.

44. The method of claim 5 wherein the drying vapor is formed from isopropyl alcohol.

45. The method of claim 9 wherein the object is a wafer substrate.

46. The method of claim 9 wherein the liquid chemical is hydrofluoric acid.

47. The method of claim 11 wherein the object is a wafer substrate.

48. The method of claim 11 wherein the liquid chemical is hydrofluoric acid.

49. The method of claim 11, wherein the method further includes the step of reclaiming drying vapor from the vessel and condensing the reclaimed drying vapor to a liquid form.

50. The method of claim 11 wherein the drying vapor is formed from isopropyl alcohol.

51. The method of claim 11 wherein the rinse fluid is deionized water.

52. The method of claim 11 wherein the method includes the step of rinsing the objects in ozonated water.

53. The method of claim 52, including the step of rinsing the object with ozonated rinse fluid prior to step (d).

54. The method of claim 18 wherein the object is a wafer substrate.

55. The method of claim 18 wherein the residual process fluid includes deionized water.

56. The method of claim 18 wherein the residual process fluid is hydrofluoric acid.

57. The method of claim 25 wherein the object is a wafer substrate.

58. The method of claim 27 wherein the object is a wafer substrate.

59. The method of claim 27 further including the step of introducing a heated gas into the vessel after step (d) to volatilize condensed drying vapor from the surface.

60. The method of claim 27 wherein the drying vapor is formed from isopropyl alcohol.

61. The method of claim 32 wherein the object is a wafer substrate.

62. A method of treating and drying the surface of an object, comprising the steps of:
(a) providing a vessel and at least one object having a surface;
(b) immersing the object in a process fluid in the vessel;
(d) performing a quick dump to discharge the process fluid from the vessel, leaving residual process fluid on the surface of the object;
(e) after discharging the process fluid from the vessel, introducing a drying vapor into the vessel, the drying vapor condensing on the surface of the object and reducing the surface tension of the residual process fluid, causing the residual process fluid to flow off of the surface; and
(f) purging the drying vapor from the vessel while maintaining the pressure within the vessel at or above a subatmospheric level.

63. A method of treating and drying the surface of an object, comprising the steps of:
(a) providing a vessel and at least one object having a surface;
(b) immersing the object in a liquid chemical within the vessel to treat the object;
(c) introducing a rinse fluid into the vessel to rinse the chemical from the vessel and from the surface of the object;
(d) performing a quick dump to discharge the rinse fluid from the vessel, leaving residual rinse fluid on the surface of the object; and
(e) after discharging the rinse fluid from the vessel, introducing a drying vapor into the vessel, the drying vapor condensing on the surface of the object and reducing the surface tension of the residual rinse fluid, causing the residual rinse fluid to flow off of the surfaces; and
(f) purging the drying vapor from the vessel while maintaining the pressure within the vessel at or above a subatmospheric level.

64. A method of treating and drying the surface of an object, comprising the steps of:
(a) providing a vessel and at least one object having a surface;
(b) immersing the object in a process fluid in the vessel;
(d) performing a quick dump to discharge the process fluid from the vessel, leaving residual process fluid on the surface of the object;
(e) after discharging the process fluid from the vessel, introducing a drying vapor into the vessel, the drying vapor condensing on the surface of the object and reducing the surface tension of the residual process fluid, causing the residual process fluid to flow off of the surface; and
(f) introducing a heated gas into the vessel after step (d) to volatilize condensed drying vapor from the surface.

65. A method of treating and drying the surface of an object, comprising the steps of:
(a) providing a vessel and at least one object having a surface;
(b) immersing the object in a liquid chemical within the vessel to treat the object;
(c) introducing a rinse fluid into the vessel to rinse the chemical from the vessel and from the surface of the object;
(d) performing a quick dump to discharge the rinse fluid from the vessel, leaving residual rinse fluid on the surface of the object; and
(e) after discharging the rinse fluid from the vessel, introducing a drying vapor into the vessel, the drying vapor condensing on the surface of the object and reducing the surface tension of the residual rinse fluid, causing the residual rinse fluid to flow off of the surfaces; and
(f) introducing a heated gas into the vessel after step (d) to volatilize condensed drying vapor from the surface.

66. A method of treating and drying the surface of an object, comprising the steps of:
(a) providing a vessel and at least one object having a surface;
(b) immersing the object in a process fluid in the vessel, the process fluid having a liquid level;
(d) discharging the process fluid from the vessel so as to drop the liquid level of the process fluid to an elevation beneath the elevation of the surface, leaving residual process fluid on the surface of the object;
(e) after discharging the process fluid from the vessel such that any remaining liquid level is at an elevation lower than the surface, introducing a drying vapor into the vessel, the drying vapor being substantially free of vapor previously exhausted from the vessel, the drying vapor condensing on the surface of the object and reducing the surface tension of the residual process fluid, causing the residual process fluid to flow off of the surface.

67. A method of treating and drying the surface of an object, comprising the steps of:
(a) providing a vessel and at least one object having a surface;
(b) immersing the object in a liquid chemical within the vessel to treat the object;
(c) introducing a rinse fluid into the vessel to rinse the chemical from the vessel and from the surface of the object, the rinse fluid having a liquid level within the vessel;
(d) discharging the rinse fluid from the vessel so as to drop the liquid level of the process fluid to an elevation beneath the elevation of the surface, leaving residual rinse fluid on the surface of the object; and
(e) after discharging the rinse fluid from the vessel such that any remaining liquid level is at an elevation lower than the surface, introducing a drying vapor into the vessel, the drying vapor being substantially free of vapor previously exhausted from the vessel, the drying vapor condensing on the surface of the object and reducing the surface tension of the residual rinse fluid, causing the residual rinse fluid to flow off of the surfaces.

68. A method of treating and drying the surface of an object, comprising the steps of:
(a) providing a vessel and at least one object having a surface;
(b) immersing the object in a process fluid in the vessel;
(d) performing a quick dump to discharge the process fluid from the vessel in less than 5 seconds, leaving residual process fluid on the surface of the object;
(d) after discharging the process fluid from the vessel, introducing a drying vapor into the vessel, the drying vapor condensing on the surface of the object and reducing the surface tension of the residual process fluid, causing the residual process fluid to flow off of the surface.

69. A method of treating and drying the surface of an object, comprising the steps of:
(a) providing a vessel and at least one object having a surface;
(b) immersing the object in a liquid chemical within the vessel to treat the object;
(c) introducing a rinse fluid into the vessel to rinse the chemical from the vessel and from the surface of the object;
(d) performing a quick dump to discharge the rinse fluid from the vessel in less than 5 seconds, leaving residual rinse fluid on the surface of the object; and
(e) after discharging the rinse fluid from the vessel, introducing a drying vapor into the vessel, the drying vapor condensing on the surface of the object and reducing the surface tension of the residual rinse fluid, causing the residual rinse fluid to flow off of the surfaces.

70. The method of claim 1 wherein the drying vapor introduced in step (d) condenses on substantially the entire surface of the object.

71. The method of claim 9 wherein the drying vapor introduced in step (e) condenses on substantially the entire surface of the object.

72. The method of claim 25 wherein the chemical treatment solution includes hydrofluoric acid.

73. The method of claim 25 wherein the chemical treatment solution includes hydrochloric acid.

74. The method of claim 26 wherein the chemical treatment solution includes ozone.

* * * * *